(12) United States Patent
Kunishige et al.

(10) Patent No.: US 10,721,416 B2
(45) Date of Patent: Jul. 21, 2020

(54) IMAGING DEVICE

(71) Applicant: Olympus Corporation, Hachioji-shi, Tokyo (JP)

(72) Inventors: Keiji Kunishige, Hachioji (JP); Masashi Takahashi, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 16/351,469

(22) Filed: Mar. 12, 2019

(65) Prior Publication Data

US 2019/0289190 A1    Sep. 19, 2019

(30) Foreign Application Priority Data

Mar. 14, 2018 (JP) .................. 2018-047107

(51) Int. Cl.
*H04N 5/235* (2006.01)
*H04N 5/232* (2006.01)
*H01L 27/146* (2006.01)
*H04N 5/225* (2006.01)

(52) U.S. Cl.
CPC ....... *H04N 5/2357* (2013.01); *H01L 27/1464* (2013.01); *H01L 27/14645* (2013.01); *H04N 5/2254* (2013.01); *H04N 5/2353* (2013.01); *H04N 5/23245* (2013.01)

(58) Field of Classification Search
CPC .. H04N 5/2357; H04N 5/2353; H04N 5/2254; H04N 5/23245; H01L 27/1464; H01L 27/14645
See application file for complete search history.

(56) References Cited

U.S. PATENT DOCUMENTS

| | | | |
|---|---|---|---|
| 2007/0046789 A1* | 3/2007 | Kirisawa | H04N 5/235 348/226.1 |
| 2007/0146501 A1* | 6/2007 | Matsuoka | H04N 5/235 348/226.1 |
| 2015/0002694 A1* | 1/2015 | Hasegawa | H04N 5/2357 348/226.1 |
| 2019/0230287 A1* | 7/2019 | Shingu | H04N 5/23258 |
| 2019/0335079 A1* | 10/2019 | Koizumi | H04N 5/2351 |

FOREIGN PATENT DOCUMENTS

JP    2004-193922    7/2004

* cited by examiner

*Primary Examiner* — Nhan T Tran
(74) *Attorney, Agent, or Firm* — John C. Pokotylo; Pokotylo Patent Services

(57) ABSTRACT

An imaging device includes an imaging unit, a sensor, and a controller. The imaging unit sequentially outputs a digital image by capturing a subject. The sensor includes a photoelectric element for receiving a part of luminous flux from the subject incident on the imaging unit. The sensor detects an AC current component of the luminous flux from the luminous flux received by the photoelectric element. The controller detects a flicker cycle in the luminous flux from the AC current component.

12 Claims, 15 Drawing Sheets

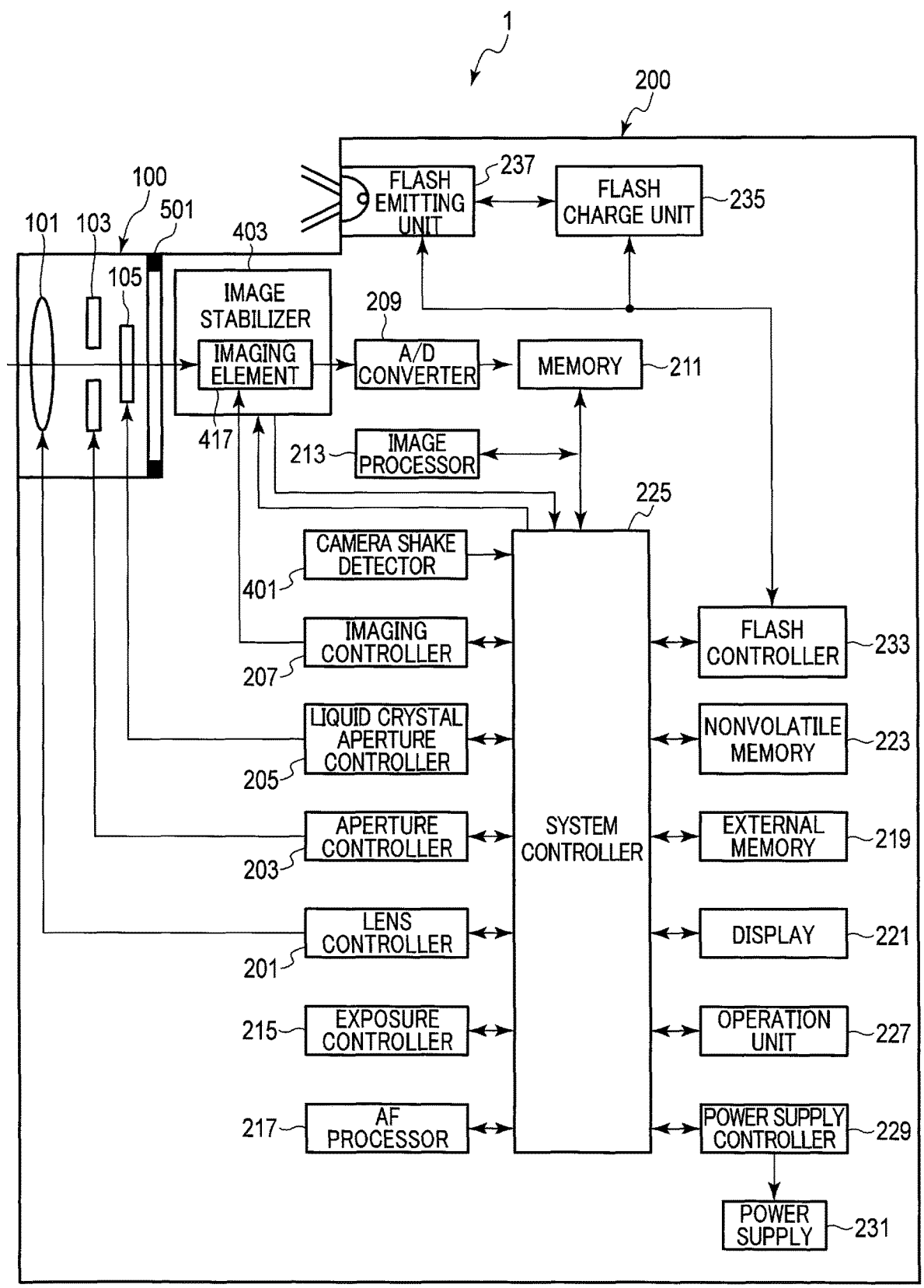
F I G. 1

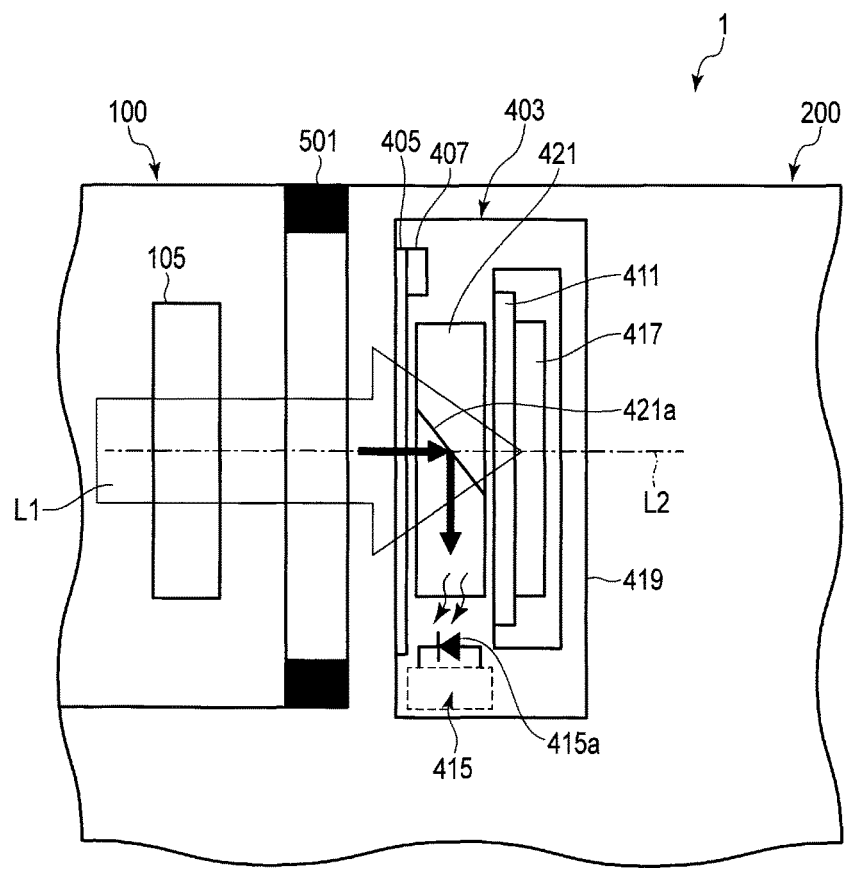
F I G. 5

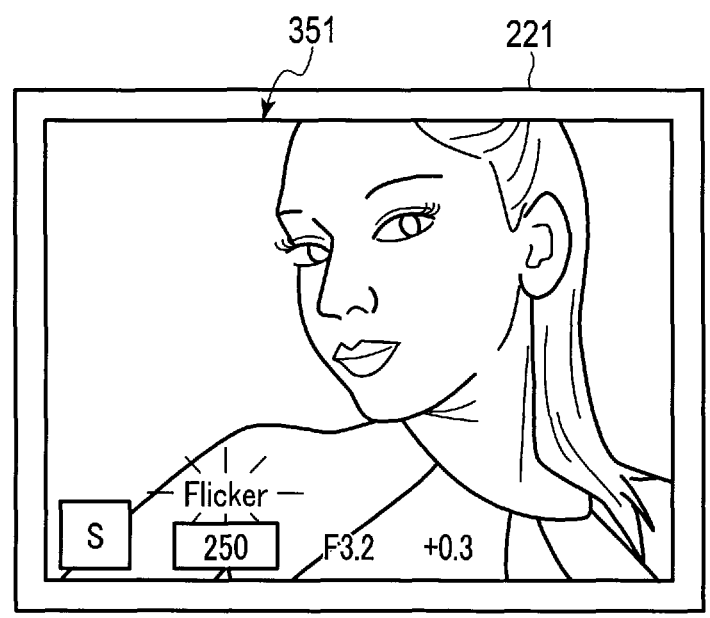
F I G. 7D

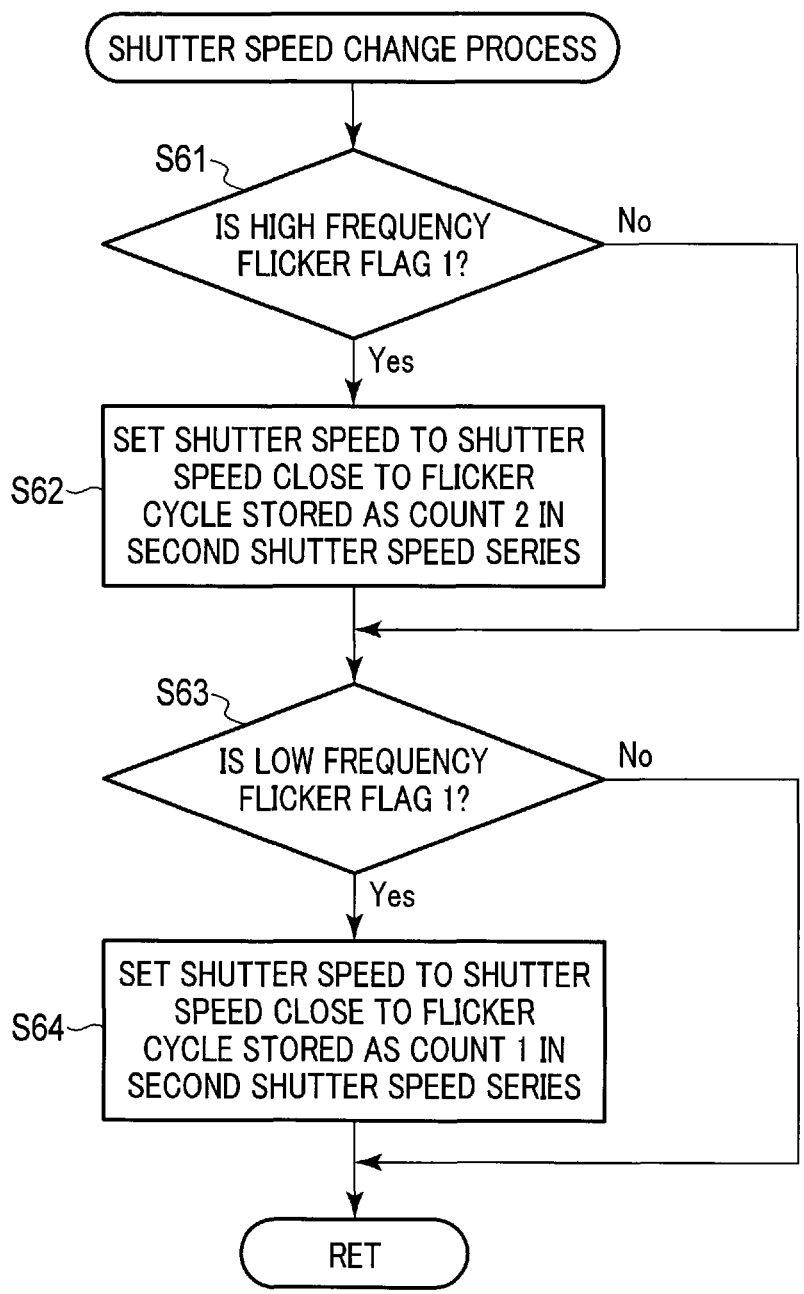
F I G. 7F

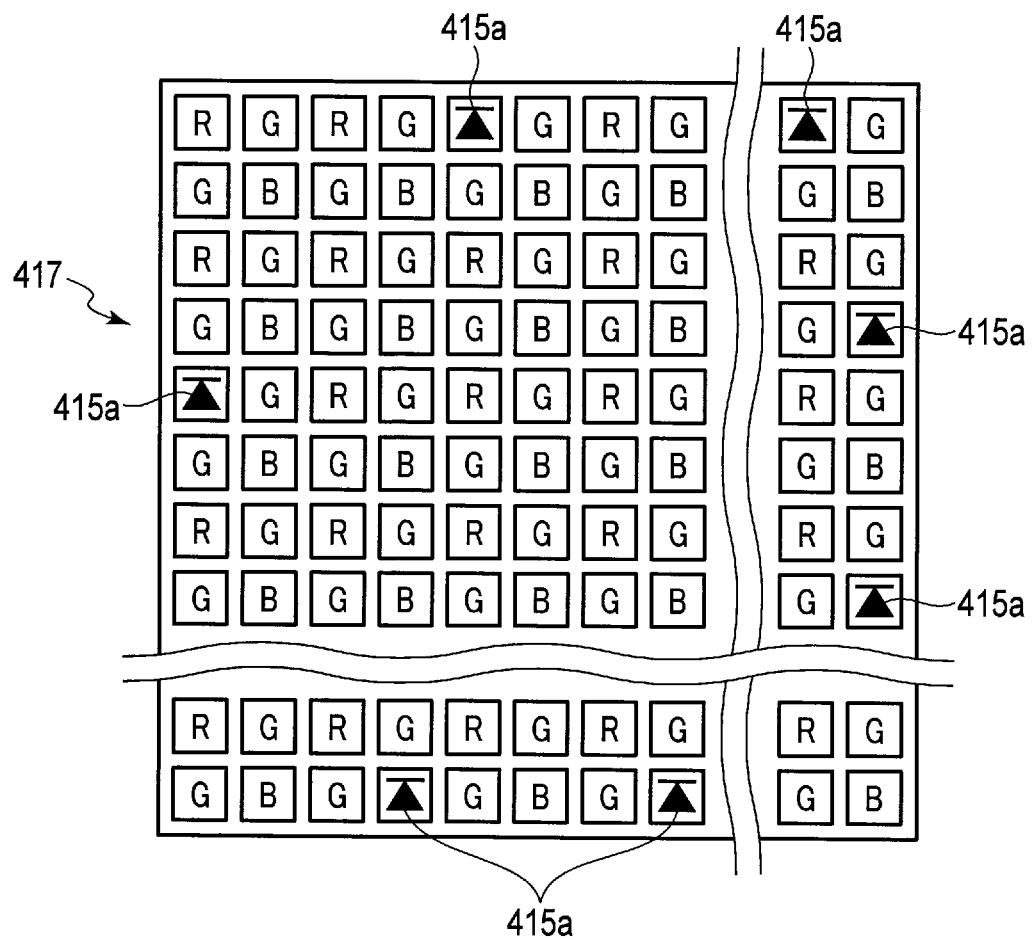
F I G. 9

IMAGING DEVICE

CROSS-REFERENCE TO RELATED APPLICATIONS

This application is based upon and claims the benefit of priority from the prior Japanese Patent Application No. 2018-047107, filed Mar. 14, 2018, the entire contents of which are incorporated herein by reference.

BACKGROUND OF THE INVENTION

1. Field of the Invention of the Related Art

Exemplary embodiment relates to an imaging device.

2. Description of the Related Art

A fluorescent lamp flickers at 100 Hz (power supply frequency of 50 Hz) or 120 Hz (power supply frequency of 60 Hz). It has been known that lateral stripes due to flicker may occur in a photographed image when photographing is performed under a flicker light source repeating the flicking. Examples of a method for suppressing an influence of the lateral stripes due to the flicker may include Jpn. Pat. Appln. KOKAI Publication No. 2004-193922. A camera device disclosed in Jpn. Pat. Appln. KOKAI Publication No. 2004-193922 detects a flicker cycle of the fluorescent lamp and performs photographing at a high-speed shutter speed in the vicinity of a peak, at which brightness is relatively stable, in synchronization with the flicker cycle, thereby reducing the influence of the flickering.

BRIEF SUMMARY OF THE INVENTION

According to an embodiment, there is provided an imaging device, comprising: an imaging unit configured to sequentially output a digital image by capturing a subject; a sensor configured to include a photoelectric element for receiving a part of luminous flux from the subject incident on the imaging unit to detect an AC current component of the luminous flux from the luminous flux received by the photoelectric element; and a controller configured to detect a flicker cycle in the luminous flux from the AC current component.

Advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing a configuration of a camera system as an example of an imaging device according to a first embodiment of the present invention;

FIG. 5 is a diagram showing a modification of the configuration of the image stabilizer shown in FIG. 3;

FIG. 7D is an example of a display which displays a warning indicating the presence of a flicker cycle;

FIG. 7F is a flowchart showing an operation of the camera system for a shutter speed change process;

FIG. 9 is a diagram showing a modification of the configuration of the imaging element in which the optical element is incorporated.

DETAILED DESCRIPTION OF THE INVENTION

Hereinafter, each embodiment will be described with reference to the drawings. For clarity of illustration, some of members will be omitted in some drawings.

First Embodiment

Figure 2:
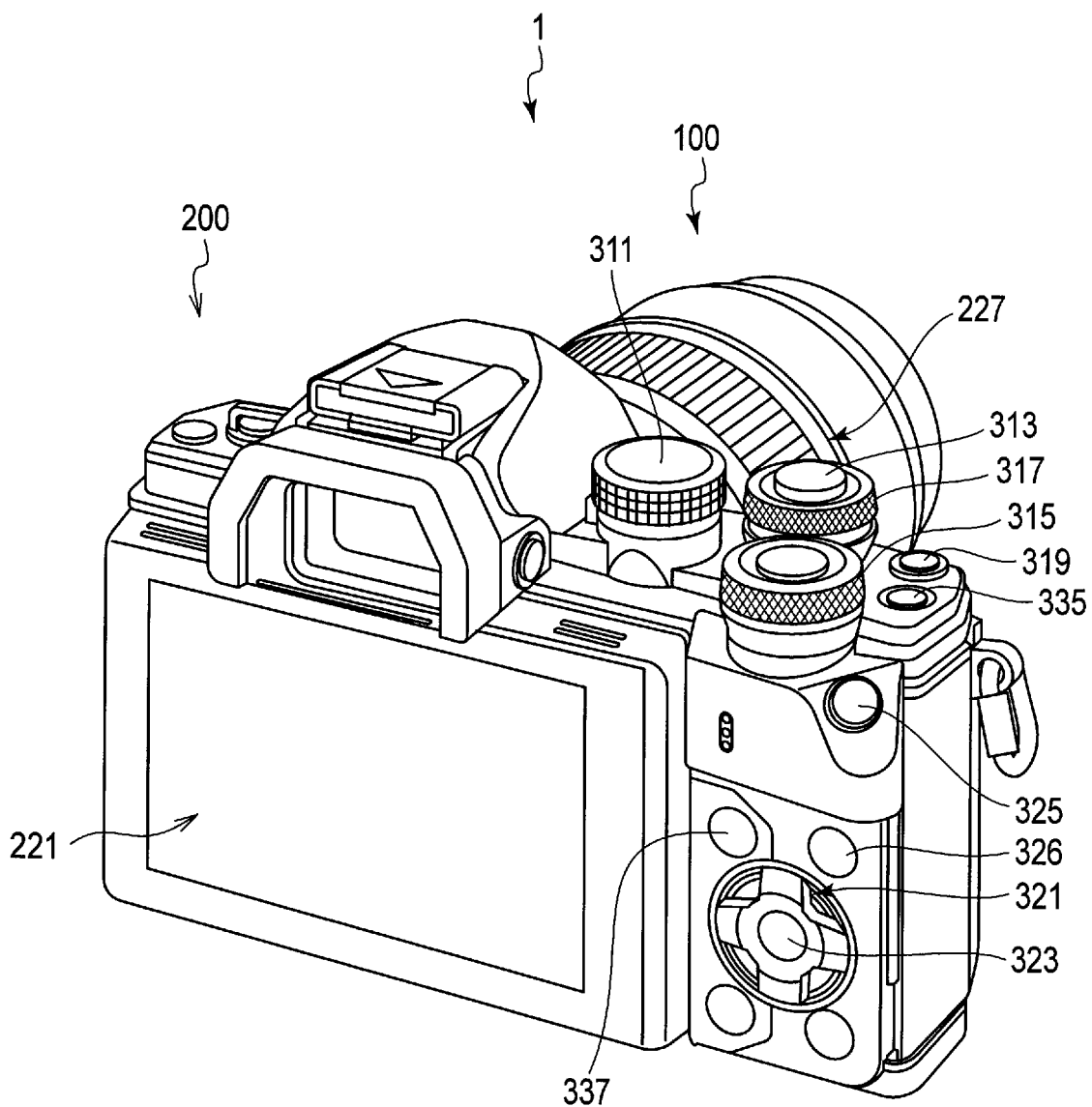
FIG. 2 is a diagram showing an appearance configuration of the camera system.

A first embodiment will be described with reference to FIGS. 1 and 2. FIG. 1 is a block diagram showing a configuration of a camera system 1 as an example of an imaging device according to a first embodiment. FIG. 2 is a diagram showing an appearance configuration of the camera system 1.

As shown in FIGS. 1 and 2, the camera system 1 is a lens integrated type camera system in which a lens 100 and a camera body 200 are integrally formed. The camera system 1 may not be necessarily a lens integrated type camera system. For example, the camera system 1 may be a lens interchangeable camera system in which an interchangeable lens is configured to be detached from a camera body 200.

As shown in FIG. 1, a lens 100 has an imaging lens 101, an aperture 103, and a liquid crystal aperture 105. The imaging lens 101 is an optical system for forming a luminous flux from a subject on an imaging element 417 of the camera body 200 to be described later. The imaging lens 101 is a single lens or a plurality of lenses which include a focus lens. Here, the imaging lens 101 may be constituted by a zoom lens. The aperture 103 is disposed on an optical axis of the imaging lens 101, and a caliber of the aperture is configured to be mechanically variable. The aperture 103 regulates the amount of luminous flux from a subject which passes through the imaging lens 101 and is incident on the imaging element 417. The liquid crystal aperture 105 is disposed on the optical axis of the imaging lens 101, and is disposed between the aperture 103 and the imaging element 417. The liquid crystal aperture 105 is configured to electrically limit a transmission of light by a voltage applied to a liquid crystal. The liquid crystal aperture 105 regulates the amount of luminous flux from a subject which passes through the aperture 103 and is incident on the imaging element 417.

The camera body 200 includes a lens controller 201, an aperture controller 203, a liquid crystal aperture controller 205, a camera shake detector 401, the imaging element 417, an imaging controller 207, an analog-to-digital (A/D) converter 209, a memory 211, an image processor 213, an exposure controller 215, an AF processor 217, an external memory 219, a display 221, a nonvolatile memory 223, a system controller 225, an operation unit 227, a power supply controller 229, a power supply 231, a flash controller 233, a flash charge circuit 235, and a flash emitting unit 237. Here, each block of the camera body 200 is constituted by hardware, for example. However, each block may not be necessarily constituted by hardware, or may be constituted by software. In addition, each block of the camera body 200 may not be constituted by single hardware or software, or may be constituted by a plurality of hardware or software.

The lens controller 201 drives the focus lens or the zoom lens of the imaging lens 101 based on the control signal from the system controller 225. The aperture controller 203 controls the caliber of the aperture 103 based on the control signal from the system controller 225. The liquid crystal aperture controller 205 controls a voltage applied to the liquid crystal aperture 105 based on the control signal from the system controller 225.

The camera shake detector 401 includes, for example, an acceleration sensor or an angular velocity sensor. The camera shake detector 401 detects the amount and direction of camera shake applied to the camera system 1 at the time of the photographing. The camera shake detector 401 outputs the detection result to the system controller 225. The system controller 225 calculates correction information for canceling camera shake based on the detection result of the camera shake detector 401. The system controller 225 outputs the correction information to the image stabilizer 403. Based on the correction information, the image stabilizer 403 controls the moving amount and the moving direction of the image stabilizer 403 in a plane orthogonal to the optical axis L2 (see FIG. 3) which is the central axis of the luminous flux L1 from the subject incident on the imaging element 417. The plane includes an X axis orthogonal to the optical axis L2, and a Y axis orthogonal to the optical axis L2 and the X axis. The X axis extends along, for example, the vertical direction of the paper surface. The camera shake detector 401 moves the imaging element 417 within the plane perpendicular to the optical axis L2.

Figure 3:
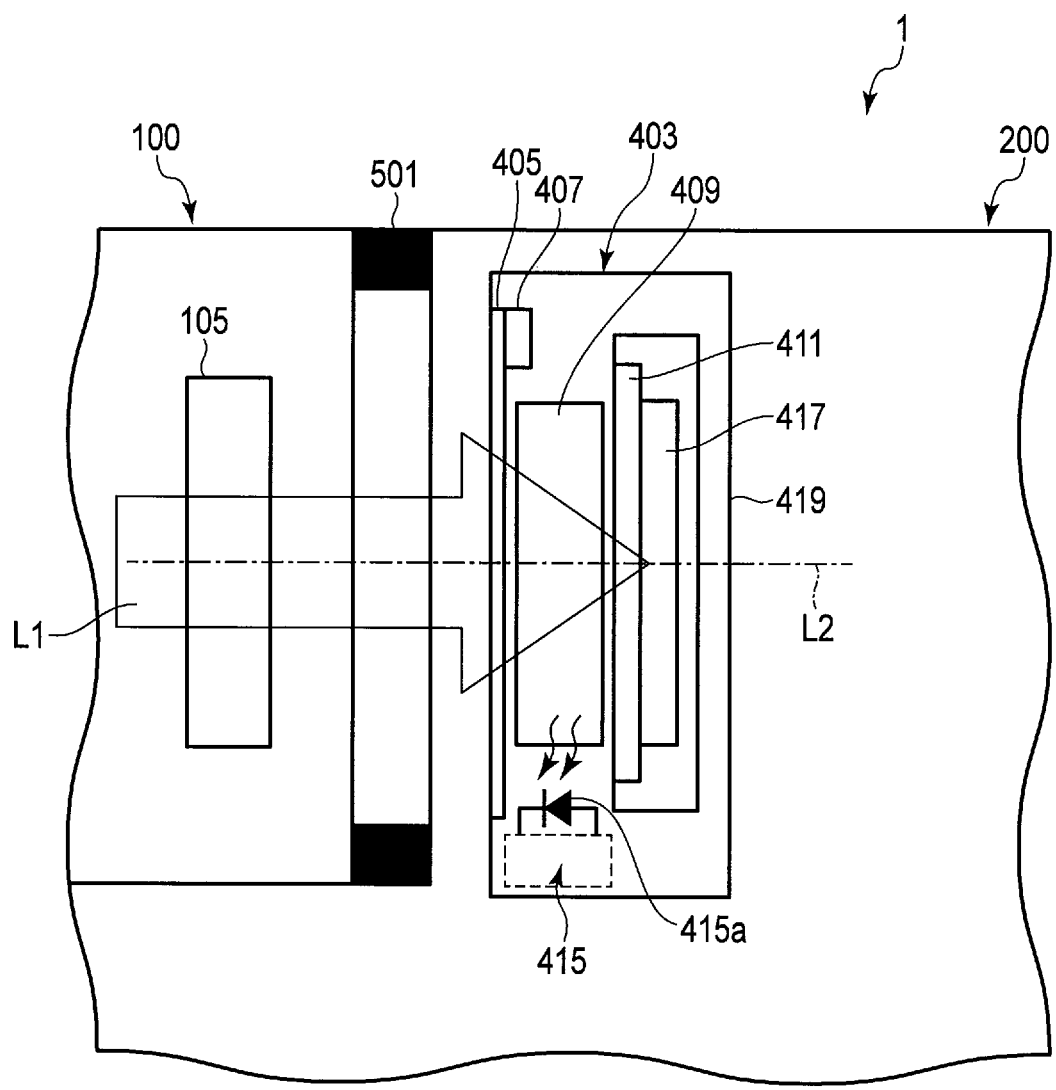
FIG. 3 is a diagram showing a configuration of an image stabilizer mounted on the camera system.

The image stabilizer 403 is disposed behind the mount 501 for detachably fixing the lens 100 to the camera body 200. As shown in FIG. 3, the image stabilizer 403 includes a dust proof glass 405, an ultrasonic driver 407, a low pass filter 409, an infrared cut filter 411, a sensor 415 having a photoelectric element 415a, an imaging element 417, and a housing 419.

The dust proof glass 405 is disposed behind the mount 501. In addition, the dust proof glass 405 is disposed in the opening of the housing 419 and seals the inside of the housing 419. The dust proof glass 405 protects the low pass filter 409, the infrared cut filter 411, the imaging element 417, and the sensor 415 stored in the housing 419 from dust and the like. The low pass filter 409, the infrared cut filter 411, and the imaging element 417 are disposed inside the housing 419 in this order from the dust proof glass 405 toward the bottom surface of the housing 419. The dust proof glass 405 transmits the luminous flux L1. The dust proof glass 405 is hard.

The ultrasonic driver 407 is attached to the outside of the effective area of the dust proof glass 405 through which the luminous flux L1 passes by, for example, an adhesive. The outside of the effective area is, for example, a peripheral portion of the back surface of the dust proof glass 405. The ultrasonic driver 407 is a vibration applying member for giving a predetermined vibration to the dust proof glass 405. The ultrasonic driver 407 includes, for example, a piezoelectric element. Upon reception of a predetermined drive voltage from the system controller 225, the ultrasonic driver 407 vibrates and transmits the vibration to the dust proof glass 405. Dust and the like attached to the dust proof glass 405 are removed from the dust proof glass 405 by the vibration.

The low pass filter 409 cuts the spatial frequency component of the luminous flux L1 higher than the Nyquist frequency of the imaging element 417 and transmits the spatial frequency component of the luminous flux L1 lower than the Nyquist frequency.

The infrared cut filter 411 cuts infrared light having a wavelength longer than a predetermined value such as 700 nm in the luminous flux L1. The infrared cut filter 411 may have a structure in which a part of the infrared light having a wavelength longer than a predetermined value such as 700 nm in the luminous flux L1 is reflected toward the low pass filter 409.

In the case in which the camera system 1 is configured as a mirrorless single-lens camera in which the mirror box is eliminated and the back focus is reduced to the limit, it is difficult to secure the arrangement space for the sensor 415 inside the housing of the camera body 200. In order to stably maintain the positional relationship with the imaging element 417, the sensor 415 is disposed near the low pass filter 409 in the image stabilizer 403. The sensor 415 may be disposed at a position capable of receiving the stray light of the luminous flux L1 incident on the imaging element 417. In this arrangement, the low pass filter 409 also functions as a light guide member for guiding a part of the luminous flux L1 incident on the imaging element 417 to the photoelectric element 415a. The photoelectric element 415a receives a part of the luminous flux L1 incident on the imaging element 417. Here, the amount of light received by the photoelectric element 415a by the light guiding of the low pass filter 409 is, for example, about 1% or less of the amount of light that passes through the low pass filter 409 and is incident on the imaging element 417. The photoelectric element 415a is required to receive more light from the luminous flux L1. When the infrared cut filter 411 is a reflection filter, the photoelectric element 415a preferably has sensitivity in the infrared region such that the photoelectric element 415a can also receive the luminous flux (infrared light) guided to the photoelectric element 415a by the low pass filter 409 after being reflected by the infrared cut filter 411 toward the low pass filter 409.

Figure 4:
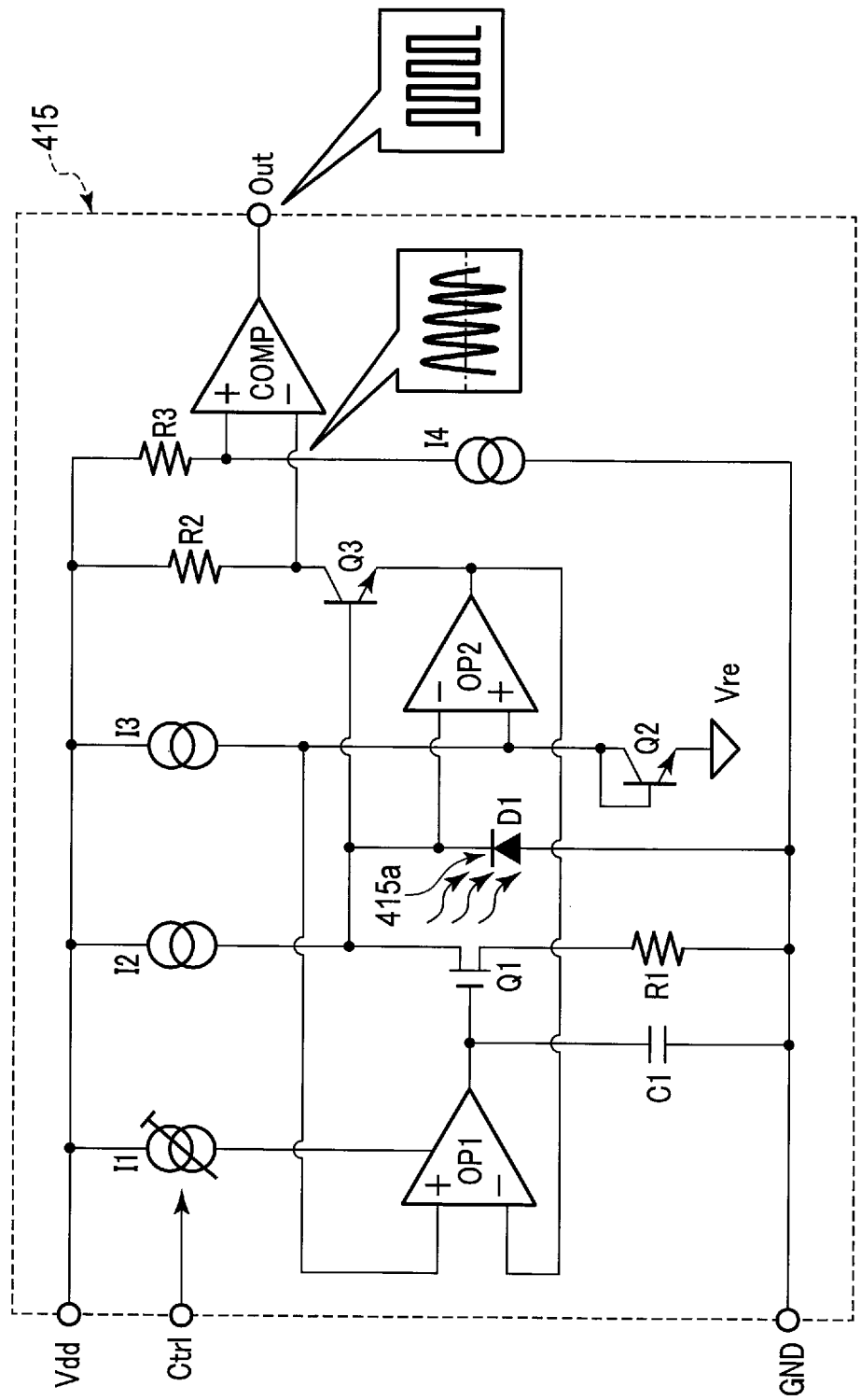
FIG. 4 is a diagram showing an example of a circuit configuration of a sensor mounted on the image stabilizer.

The sensor 415 detects the AC current component of the luminous flux from the luminous flux received by the photoelectric element 415a. Since the amount of light received by the photoelectric element 415a is about 1% or less of the amount of light incident on the imaging element 417, the sensor 415 has a detection circuit (see FIG. 4) having an ability to detect minute AC current of 100 Hz to several 10 kHz of several 100 pA to several 10 nA. In the detection circuit, the photoelectric element 415a includes, for example, a photodiode D1. The AC current output from the photoelectric element 415a is multiplied by the transistor Q3 and is output as the waveform to the resistor R2. In addition, in the detection circuit, the voltage of the current source I1 is controlled by the system controller 225 via the control (Ctrl) terminal, and when the current amount of the current source I1 changes, the response characteristic of the operational amplifier OP1 changes. Thus, it is possible to change the frequency response characteristic of the frequency (for example, 50 Hz to several hundreds kHz) that can be measured (detected) by the photoelectric element 415a.

In the case in which the camera system 1 is configured as a single lens reflex camera, the distance measurement circuit disposed in the mirror box or the photometric circuit of the pentaprism may function as the detection circuit of the sensor 415. The sensor 415 may be mounted as the detection circuit in the distance measurement circuit or the photometric circuit.

In addition, as shown in FIG. 5, instead of the low pass filter 409, the optical glass 421 through which the luminous flux L1 passes may be disposed. The optical glass 421 may include an infrared reflection filter 421a disposed in the central portion or the substantially central portion of the effective area of the optical glass 421 through which the luminous flux L1 passes. The infrared reflection filter 421a reflects, to the photoelectric element 415a, nearly 100% of the infrared light having a wavelength longer than a predetermined value such as 700 nm of the luminous flux L1 incident on the imaging element 417. Therefore, the photoelectric element 415a shown in FIG. 5 can receive more infrared light than the photoelectric element 415a shown in FIG. 3, and the configuration shown in FIG. 5 can further improve the detection accuracy.

The imaging element 417 as an imaging unit is disposed on the optical axis of the imaging lens 101 and is disposed behind the liquid crystal aperture 105 and at a position where the luminous flux from a subject is formed by the imaging lens 101. The imaging element 417 has pixels arranged two-dimensionally or three-dimensionally. Each pixel generates charges depending on a light receiving amount. In addition, a color filter is formed in each pixel. Such an imaging element 417 captures a subject (subject field) to generate an image signal. Here, the imaging element 417 may have focus detection pixels. The imaging controller 207 drives the imaging element 417. In addition, the imaging controller 207 controls reading of an image signal generated by the imaging element 417.

The A/D converter 209 converts the image signal output from the imaging element 417 into image data in a digital format.

The memory 211 is, for example, an SDRAM which is electrically rewritable, and temporarily stores various data such as the image data output from the A/D converter 209 or the image processor 213 and process data in the AF processor 217 or the system controller 225. A DRAM may be used for temporary storage.

The image processor 213 performs various image processes on image data. The image processor 213 may be constituted by hardware, software, or a combination of hardware and software. The image processor 213 performs the basic image process necessary for displaying or recording an image on the image data. This basic image process includes, for example, white balance (WB) correction process, color reproduction process, gradation correction process, edge emphasizing process, and noise reduction process. The image processor 213 performs special image process for imparting a special visual effect to the image data. The special image process includes, for example, trimming process and contrast emphasizing process. These special image processes are, for example, used for highlighting lateral stripes in a first live view display mode described later.

The exposure controller 215 performs automatic exposure (AE) process. Specifically, the exposure controller 215 controls photographing conditions (for example, an enlargement magnification, an aperture value, and a value of a shutter speed) based on brightness of a subject acquired from the image data or the like or based on the setting of the operation unit 227.

The AF processor 217 performs automatic focus adjustment (AF) process. Specifically, the AF processor 217 controls the driving of the focus lens included in the imaging lens 101 based on focus information acquired from the image data or the like. The focus information may be, for example, an AF evaluation value (contrast value) calculated from the image data, or may be a defocus amount calculated from an output of a focus detection pixel or the like.

The external memory 219 is a storage medium such as a flash memory, and is configured to be loaded in the camera body 200. The external memory 219 stores the image data processed by the image processor 213 as an image file in a predetermined format.

The display 221 is, for example, a display such as a liquid crystal display or an organic EL display, and is disposed on, for example, a back surface (see FIG. 2) of the camera body 200. The display 221 is driven by the system controller 225, and displays various images such as a still image or a movie. Here, the display 221 is not necessarily provided in the camera body 200. The display 221 may be, for example, a TV monitor or the like which is communicatively connected to the camera body 200. The display 221 may have a function of a touch panel or the like which performs the same functions as operations of operation members such as various kinds of buttons and dials of the operation unit 227.

The nonvolatile memory 223 is a storage medium such as the flash memory, and is configured to be embedded in the camera body 200. The nonvolatile memory 223 stores programs necessary for the operation of the camera body 200. In addition, the nonvolatile memory 223 stores information necessary for various processes of the camera body 200. This information includes information of parameters of image process, for example.

The system controller 225 is, for example, a microcomputer, and controls each block of the camera body 200 according to the programs stored in the nonvolatile memory 223. The system controller 225 is not necessarily constituted by the microcomputer, and may be constituted by a CPU, an ASIC, an FPGA, or the like.

The power supply controller 229 controls the supply of power from the power supply 231 according to a turn on state or a turn off state of a power supply button (not shown) which is disposed on the operation unit 227 of the camera body 200. When the power supply button is in the turn on state, the power supply 231 supplies power to each block of the camera body 200. When the power supply button is in the turn off state, the power supply 231 stops supplying power to each block. The power supply 231 may be, for example, a primary battery or a secondary battery, or may be one supplied with power from an external power supply (not shown).

The flash controller 233 controls driving or stopping of each of the flash charge circuit 235 and the flash emitting unit 237. The flash charge circuit 235 includes a charge circuit for charging power necessary for flash emission by the flash emitting unit 237. The flash emitting unit 237 has, for example, an LED light source and a reflecting umbrella. The flash emitting unit 237 emits illumination light in response to an instruction of flash emission from the flash controller 233.

As shown in FIG. 2, the operation unit 227 includes a photographing mode dial 311, a release button (shutter button) 313, an R-dial 315, an F-dial 317, an enlargement button 319, an arrow button 321 which is a menu button, an OK button 323 which is a decision button, a display mode change button 325, a drive button 326, a movie button 335, and a teleconverter button 337. The operation unit 227 detects operation states of operation members such as various buttons and dials, and outputs a signal indicating the detected result to the system controller 225.

The photographing mode dial 311 is a dial for selecting a photographing mode of the camera system 1. The photographing mode includes, for example, a program photographing mode (hereinafter, referred to as a P mode), an aperture priority photographing mode (hereinafter, referred to as an A mode), a shutter priority photographing mode (hereinafter, referred to as an S mode), a manual photographing mode (hereinafter, referred to as an M mode). The release button 313 is a button for instructing the system controller 225 to photograph a still image. The release button 313 is a two-step type push button. A state in which the release button 313 is shallowly depressed up to a first stage is referred to as a half depression, and a state in which the release button 313 is deeply depressed up to a second stage is referred to as a full depression. A subject is focused by the half depression, and a still image is captured by the full depression. The movie button 335 is a button for instructing the system controller 225 to photograph a movie. The teleconverter button 337 is a button for instructing the system controller 225 to enlarge a part of an image.

The R-dial 315 and the F-dial 317 are dials which change the function assigned by the operation state of the camera body 200. For example, during the photographing of the still image, the R-dial 315 functions as the dial for instructing the system controller 225 to change the shutter speed of the imaging element 417. In addition, for example, during the photographing of the still image, the F-dial 317 functions as the dial for instructing the system controller 225 to change the enlargement magnification of the imaging element 417.

The enlargement button 319 is a button for instructing the system controller 225 to enlarge a part of the image displayed on the display 221.

The drive button 326 is a button for instructing the system controller 225 to display a drive mode of the imaging element 417. When the drive button 326 is depressed, a menu screen for displaying the drive mode is displayed on the display 221. The drive mode corresponds to an imaging sequence, and includes, for example, single photographing mode, a continuous photographing mode, or the like. In addition, the drive mode is associated with the shutter. That is, when the drive mode is determined, the shutter to be used is determined. The shutter includes, for example, a mechanical shutter, an electronic front curtain shutter, an electronic rolling shutter, or the like. The drive mode and the shutter mode may be set individually.

The arrow button 321 is a button for instructing the change and setting of various setting values of the camera body 200 and the change and setting of various modes. The arrow button 321 is also a button for changing a shutter speed series of the imaging element 417 to any of a first shutter speed series and a second shutter speed series smaller than the first shutter speed series. Here, the shutter speed series is a series of values of the shutter speed which can be set for the imaging element 417. The system controller 225 controls an exposure time of the imaging unit in accordance with the first shutter speed series or the second shutter speed series which is switched by the arrow button 321. The values of the shutter speed included in each of the first shutter speed series and the second shutter speed series is stored in the nonvolatile memory 223.

The OK button 323 is a button for determining the change and setting of various setting values. The OK button 323 is also a button for determining the change and setting of various modes.

The display mode change button 325 is a button for changing the live view display mode of the camera body 200 to any of the normal live view display mode based on the first shutter speed series and the live view display mode based on the second shutter speed series. The live view display mode based on the second shutter series has the second live view display mode in addition to the first live view display mode. The display mode change button 325 is also a button for changing the live view display mode of the camera body 200 to any of the first live view display mode and the second live view display mode under the live view display mode based on the second shutter speed series. The display 221 displays a digital image in the live view display mode which is changed by the display mode change button 325.

Next, the normal live view display mode and the first and second live view display modes will be described.

The normal live view display mode is a live view display mode, which allows a user to perform framing, in order to perform the photographing based on the first shutter speed series. In the normal live view display mode, the image subjected to the basic image process based on the white balance and a picture mode which are designated by the user is displayed on the display 221. The image displayed in the normal live view display mode is referred to as a normal live view image 351 (see FIG. 3).

The first and second live view display modes are the live view display mode for performing the photographing based on the second shutter speed series in order to suppress the occurrence of the lateral stripes which can occur under the flicker light source which repeats the flickering.

In the first live view display mode, the imaging element 417 is driven by the still image imaging sequence (the frame rate, the exposure time, and the like). In the first live view display mode, an image generated from a high-definition image of all pixels obtained in the still image imaging sequence is live-view-displayed. In the second live view display mode, a reading speed is increased by addition of pixels, thinning-out reading of pixels or the like, and the imaging element 417 is driven by the imaging sequence which prioritizes followability and visibility of the subject. This imaging sequence is different from the still image imaging sequence.

The first live view display mode is a display mode which selects and sets the shutter speed at which the lateral stripes do not occur from the second shutter speed series while the user confirms the live view. Here, for example, four shutter speed values are stored, and the user can select one value from the four values by using left and right buttons of the arrow button 321. In addition, the user can change the value itself of the selected value by using up/down buttons of the arrow button 321 while visually observing the live view. In the actual photographing, the selected value may be four or more, or may be one. The first live view display mode has a live view display mode using a low enlargement magnification for visually recognizing coarse lateral stripes or flowing lateral stripes and a live view display mode using a high enlargement magnification being aware of a pixel equal magnification for visually recognizing lateral stripes in one pixel line unit which cannot be confirmed at the low enlargement magnification. Since the coarse lateral stripes cannot be visually recognized at the high enlargement magnification, the shutter speed needs to be set in the state in which live views having two or more enlargement magnifications such as high and low enlargement magnifications are displayed. It is important to simultaneously confirm the setting of the shutter speed and the visual recognition of the lateral stripes by simply changing the setting, or the like. In the first live view display mode, the special image process may be performed out so that the lateral stripes are further emphasized to be easily recognized visually. There is also an additional effect that the first live view display mode state is easily understood by performing image process such as monochromatization.

The second live view display mode is a mode which sequentially displays images captured in the imaging sequence performing the addition of pixels or the thinning out reading of pixels on the display 221, and is a mode which performs the photographing in the second shutter speed series. In the second live view display mode, the followability and visibility of a moving subject is prioritized over the visibility of the lateral stripes, and the imaging element 417 is driven in the imaging sequence in which a refresh time is shortened at a high frame rate and a short display latency rather than the still image imaging sequence. In the second live view display mode, when the display 221 displays a 1-time full image, the addition of pixels or the thinning out of pixels is performed according to the number of pixels of the display device. By the adding or thinning out of pixels, the high-speed capability of the photographing is ensured.

In the first and second live view display modes, the shutter speed of the shutter speed series which is smaller than the shutter speed of the shutter speed series of the normal live view display mode can be selected by the arrow button 321. The shutter speed series in the normal live view display mode has, for example, values of the shutter speed such as 1 step, ½ steps, and ⅓ steps. On the other hand, the shutter speed series in the first and second live view display modes has values of a shutter speed having a finer step than the normal live view display mode, for example, values of a shutter speed such as 1/50 steps to 1/500 steps.

Figure 6:
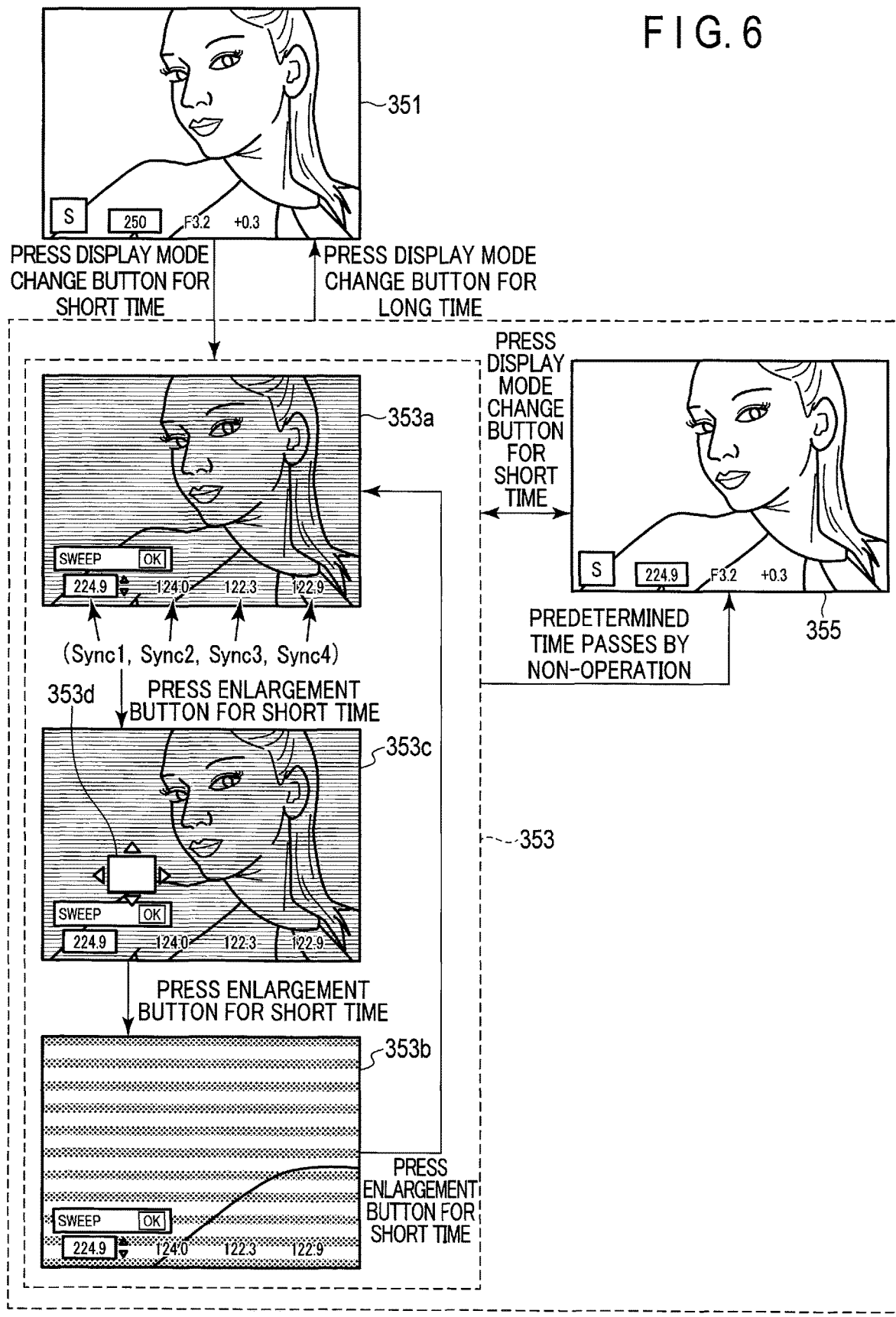
FIG. 6 is a diagram for describing each live view image displayed on a display of the camera system.

The image displayed in the first live view display mode is referred to as a first live view image 353 (see FIG. 6), and the image displayed in the second live view display mode is referred to as a second live view image 355 (see FIG. 6).

As shown in FIG. 6, in the normal live view display mode, when the display mode change button 325 is depressed for a short time (hereinafter, referred to as a short depression), the system controller 225 performs changing from the normal live view display mode to the first live view display mode. As a result, the image to be displayed is changed from the normal live view image 351 to the first live view image 353. In addition, in the first and second live view display modes, when the display mode change button 325 is depressed for a long time (hereinafter, referred to as a long depression), the system controller 225 is changed from the first and second live display modes to the normal live view display mode. As a result, the image to be displayed is changed from the first live view image 353 or the second live view image 355 to the normal live view image 351.

In the first live view display mode, when the display mode change button 325 is depressed for a short time, the system controller 225 changes the first live view display mode to the second live view display mode. As a result, the image to be displayed is changed from the first live view image 353 to the second live view image 355. In the second live view display mode, when the display mode change button 325 is depressed for a short time, the system controller 225 changes the second live view display mode to the first live view display mode. As a result, the image to be displayed is changed from the second live view image 355 to the first live view image 353.

In addition, in the first live view display mode, even when a non-operation time for which the operation member is not operated in which the operation member such as the display mode change button 325 or the enlargement button 319 is not depressed passes a predetermined time such as one minute to several minutes, the system controller 225 changes the first live view display mode to the second live view display mode. As a result, the image to be displayed is changed from the second live view image 355 to the first live view image 353. In the first live view display mode, the live view is displayed based on a high-definition image of all pixels obtained in the still image imaging sequence. As a result, in the first live view display mode, the temperature of the imaging element 417 tends to rise. When the temperature of the imaging element 417 rises, an S/N ratio of the image signal output from the imaging element 417 deteriorates. Therefore, it is difficult to perform the ideal low-noise photographing. In addition, when the temperature further rises, the operation of the imaging element 417 stops in some cases. Then, it is necessary to cool the imaging element 417 until the imaging element 417 can be operated again, such that the photographing cannot be made only if the photographing should wait for, for example, several tens of minutes until the imaging element 417 is cooled down and the photographing opportunity can be inadvertently lost. Therefore, it is preferable that the live view display by the first live view mode is not unnecessarily long. Therefore, when the non-operation time in the first live view display mode passes a predetermined time, the system controller 225 changes the display mode from the first live view display mode to the second live view display mode. Here, although the display mode is changed to the second live view display mode in order to prevent the photographing opportunity from being lost, it is not necessary to be limited thereto. For example, a short sleep time for the first live view display mode is set, the first live view image 353 temporarily disappears when the sleep time elapses, and the display mode may transition to the sleep state.

The first live view display mode has a normal magnification live view display mode and an enlarged live view display mode. The normal magnification live view display mode is a mode which displays the live view at the normal magnification. The normal magnification live view display mode is suitable for visually recognizing the coarse lateral stripes or the flowing lateral stripes. The enlarged live view display mode is a mode which displays the enlarged live view at the enlargement magnification substantially equal to or more than the pixel equal magnification. The enlarged live view display mode is suitable for visually recognizing lateral stripes of one pixel line. In addition, the first live view display mode further includes an enlarged frame display mode. The enlarged frame display mode is a mode which displays the live view at the same magnification as the normal magnification live view display mode. In the enlarged frame display mode, an enlarged frame 353d is also displayed. An area selected by the enlarged frame 353*d* may be displayed to be enlarged. Hereinafter, the image displayed in the normal magnification live view display mode is referred to as the normal magnification live view image 353*a*, the image displayed in the enlarged live view display mode is referred to as an enlarged live view image 353*b*, and the image displayed in the enlarged frame display mode is referred to as an enlarged frame display image 353*c*. The enlarged frame display image 353*c* is an image in which an enlarged frame 353*d* is added to the normal magnification live view image 353*a*. The enlarged live view image 353*b* is a high-definition enlargement image which is displayed by cutting out an area corresponding to the image enclosed by the enlarged frame 353*d* displayed in the enlarged frame display image 353*c* from the high-definition image of all pixels in correspondence with the number of pixels of the display 221. The enlarged frame 353*d* is a frame which designates an area to be enlarged. The enlarged frame 353*d* is movable up, down, left and right with respect to the enlarged frame display image 353*c* by depressing the up, down, left and right buttons of the arrow button 321, respectively.

In the normal magnification display mode of the first live view display mode, the system controller 225 changes the normal magnification live view display mode to the enlarged frame display mode by depressing the enlargement button 319 for a short time. As a result, the image to be displayed is changed from the normal magnification live view image 353*a* to the enlarged frame display image 353*c*. In the enlarged frame display mode, the enlargement button 319 is depressed for a short time, and the system controller 225 changes the enlarged frame display mode to the enlarged live view display mode. As a result, the image to be displayed is changed from the enlarged frame display image 353*c* to the enlarged live view image 353*b*. In the enlarged frame view display mode, the enlargement button 319 is depressed for a short time, and thus the system controller 225 changes the enlarged live view display mode to the normal magnification live view display mode. As a result, the image to be displayed is changed from the enlarged live view image 353*b* to the normal magnification live view image 353*a*. As described above, the enlargement button 319 is a button which sequentially (alternately) changes the normal magnification live view display mode, the enlarged live view display mode, and the enlarged frame display mode.

In the first live view image 353, a Sync number (Sync 1, Sync 2, Sync 3, and Sync 4) associated with the shutter speed series are displayed.

In the enlarged frame display image 353*c*, the enlarged frame 353*d* can be moved to the position where the fine lateral stripes desired to be confirmed by the user are easily seen by the operation of the arrow button 321.

Practically, a position of the enlarged frame 353*d*, in other words, a portion displayed in the enlarged live view image 353*b*, or in other words, a portion to be enlarged is fixed at a predetermined position of the normal magnification live view image 353*a* such as a center of the normal magnification live view image 353*a*, and therefore the enlarged frame display mode may also be omitted. In this case, the enlargement button 319 is a button for alternately changing between the normal magnification live view display mode and the enlarged live view display mode. It is possible to more quickly change between the two enlargement magnification states required for detecting lateral stripes by omitting the enlarged frame display image 353*c*. In addition, in order to prevent deterioration in visibility of lateral stripes due to a background pattern, when the focus lens is attached to the camera body 200, it may be operated so that the lens is automatically focused out only in the first live view display mode.

Figure 7A:
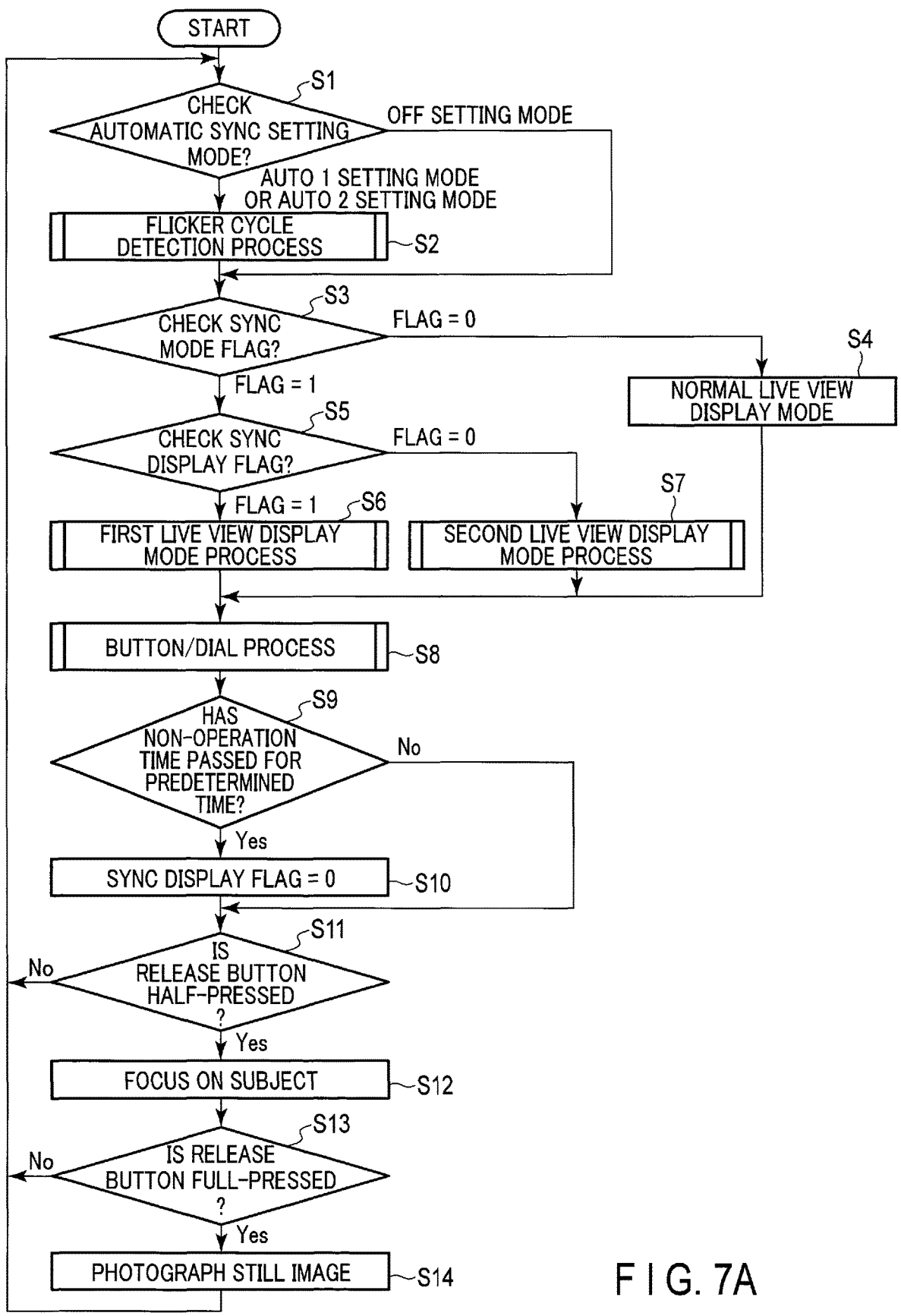
FIG. 7A is a flowchart showing an operation of the camera system for capturing a still image.

Next, the operation of the camera system 1 according to the present embodiment will be described. FIG. 7A is a flowchart showing the operation of the camera system 1 for capturing the still image. The operation of FIG. 7A is mainly controlled by the system controller 225. The operation of FIG. 7A is started when the power button (not shown) is turned on.

In step S1, the system controller 225 checks an automatic SYNC setting mode. The automatic SYNC setting mode is selected by a user from an AUTO 1 setting mode, an AUTO 2 setting mode, and an OFF setting mode. In the AUTO 1 setting mode, when it is determined by the system controller 225 that there is a flicker cycle in the luminous flux incident on the imaging element 417 in a flicker cycle detection process to be described later, a first live view display mode or a second live view display mode is driven and a shutter speed is updated every time according to the flicker cycle. That is, in the AUTO 1 setting mode, the shutter speed is set to full auto. In the AUTO 2 setting, when it is determined that there is the flicker cycle in the flicker cycle detection process, the first live view display mode or the second live view display mode is driven and the shutter speed is set according to the flicker cycle at the time of the first driving of the driven live view display mode. At the time of driving after the first driving of the live view display mode, that is, when the live view display mode is driven after the second time or later, the shutter speed is set by the user. That is, in the AUTO 2 setting mode, the shutter speed is set to semi-auto. The shutter speed set according to the flicker cycle is recorded in the nonvolatile memory 223 as the value of one indicated by the cursor among Sync 1 to Sync 4 shown in FIG. 6. In the OFF setting mode, the flicker cycle detection process to be described later is not performed and the automatic setting of the shutter speed is not also performed. The respective setting contents of the AUTO 1 setting mode, the AUTO 2 setting mode, and the OFF setting mode are recorded in the nonvolatile memory 223.

Figure 7B:
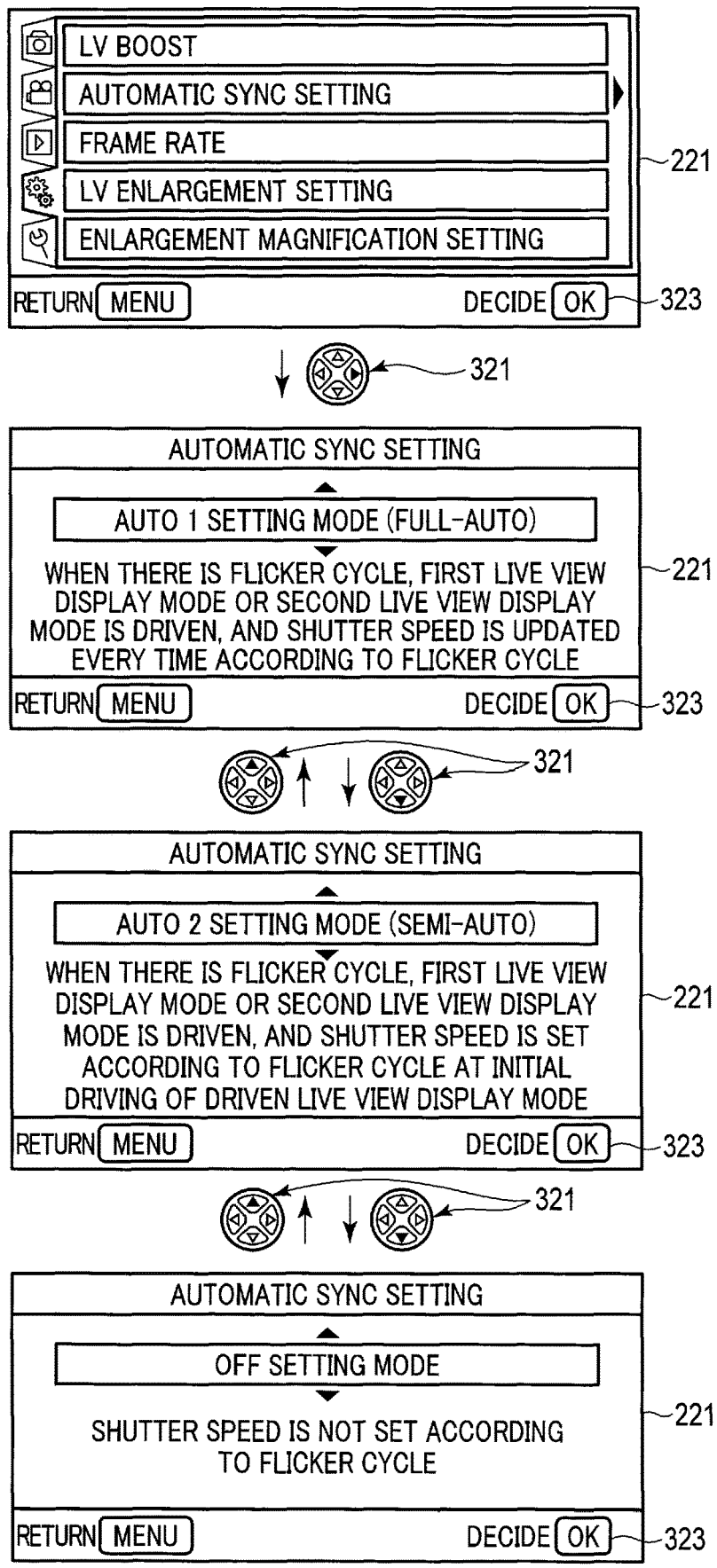
FIG. 7B is a diagram for describing changing and setting of a setting mode on an "automatic SYNC setting" screen.

As shown in FIG. 7B, the menu item "automatic SYNC setting" is selected from a custom menu displayed on the display 221 by allowing the user to operate the up button or the down button of the arrow button 321, for example. When the right button of the arrow button 321 is pressed in a state in which the "automatic SYNC setting" is selected, the "automatic SYNC setting" screen is called up and the menu item "AUTO 1 setting mode" is displayed. When the down button of the arrow button 321 is pressed in a state in which the menu item "AUTO 1 setting mode" is displayed on the "automatic SYNC setting" screen, the display of the menu item is changed to the menu item "AUTO 2 setting mode". When the down button is pressed in a state in which the menu item "AUTO 2 setting mode" is displayed on the "automatic SYNC setting" screen, the display of the menu item is changed to the menu item "OFF setting mode". When the up button of the arrow button 321 is pressed in a state in which the menu item "OFF setting mode" is displayed on the "automatic SYNC setting" screen, the display of the menu item is changed to the menu item "AUTO 2 setting mode". When the up button is pressed in a state in which the menu item "AUTO 2 setting mode" is displayed on the "automatic SYNC setting" screen, the display of the menu item is changed to the menu item "AUTO 1 setting mode". As described above, the display of the menu item on the "automatic SYNC setting" screen is sequentially changed by the operations of the up button or the down button.

When the OK button 323 is pressed in a state in which one of the AUTO 1 setting mode, the AUTO 2 setting mode, and the OFF setting mode is selected by the arrow button 321, the selected setting mode is set. As described above, the automatic SYNC setting mode is set to one of the AUTO 1 setting mode, the AUTO 2 setting mode, or the OFF setting mode by the operation of the arrow button 321 and the OK button 323 by the user who views the setting screen.

Returning to FIG. 7A, when it is determined in step S1 that the automatic SYNC setting mode is set to the AUTO 1 setting mode or the AUTO 2 setting mode, the process proceeds to step S2. In step S2, the system controller 225 performs a flicker cycle detection process to be described later. Then, the process proceeds to step S3. When it is determined in step S1 that the automatic SYNC setting mode is set to the OFF setting mode, the process proceeds to step S3. In such a configuration, if photographing is mainly performed at a photographing site having no flicker cycle, such as outdoors, it is possible to raise the response at the time of photographing standby by setting the OFF mode. In addition, if the flicker cycle detection process is performed sufficiently quickly, the process of step S1 is unnecessary. In this case, the process of step S2 may be first performed. If the process of step S1 is unnecessary and the flickering is detected in the OFF mode, a warning indicating the presence of flickering is displayed on the live view and the automatic SYNC setting mode becomes to a mode which allows the shutter speed of the flickering cycle to be manually set.

In step S3, the system controller 225 checks a SYNC mode flag which is a flag for managing the state of the live view display mode. The SYNC mode flag has two states of 0 and 1. The state of the SYNC mode flag is alternately changed according to a current state of the live view display mode and the operation of the display mode change button 325. If it is determined that the SYNC mode flag is 0, the process proceeds to step S4. In step S4, the system controller 225 performs the live view display in the normal live view display mode. Then, the process proceeds to step S8.

If it is determined in step S3 that the SYNC mode flag is 1, the process proceeds to step S5. In step S5, the system controller 225 checks a SYNC display flag which is a flag for managing the display states of the first and second live view display modes. The SYNC display flag has two states of 0 and 1. The state of the SYNC display flag is alternately changed according to a current state of the first and second live view display modes and the operation of the display mode change button 325. If it is determined that the SYNC display flag is 1, the process proceeds to step S6. In step S6, the system controller 225 proceeds to the first live view display mode process to be described later. Then, the process proceeds to step S8. In addition, if it is determined in step S5 that the SYNC display flag is 0, the process proceeds to step S7. In step S7, the system controller 225 proceeds to the second live view display mode process to be described later. Then, the process proceeds to step S8.

In step S8, the system controller 225 performs the button/dial process to be described later, and the process proceeds to step S9.

In step S9, the system controller 225 determines whether the non-operation time for which the display mode change button 325 or the enlargement button 319 is not pressed passes a predetermined time. If it is determined in step S9 that the non-operation time passes the predetermined time, the process proceeds to step S10. In step S10, the system controller 225 sets the SYNC display flag to 0, and the process proceeds to step S11. If it is determined in step S9 that the display mode change button 325 or the enlargement button 319 is pressed before the non-operation time passes the predetermined time, the process proceeds to step S11.

In step S11, the system controller 225 determines whether the release button 313 is half-pressed by the user. If it is determined in step S11 that the release button 313 is not half-pressed, the process returns to step S1. If it is determined in step S11 that the release button 313 is half-pressed, the process proceeds to step S12. In step S12, the system controller 225 controls the lens controller 201 so as to focus on the subject. Thereafter, the process proceeds to step S13.

In step S13, the system controller 225 determines whether the release button 313 is full-pressed by the user. If it is determined in step S13 that the release button 313 is not full-pressed, the process returns to step S1. If it is determined in step S13 that the release button 313 is full-pressed, the process proceeds to step S14. In step S14, the system controller 225 photographs the still image with the set values of the shutter speed, and the process returns to step S1. The photographed still image is displayed on the display 221.

Figure 7C:
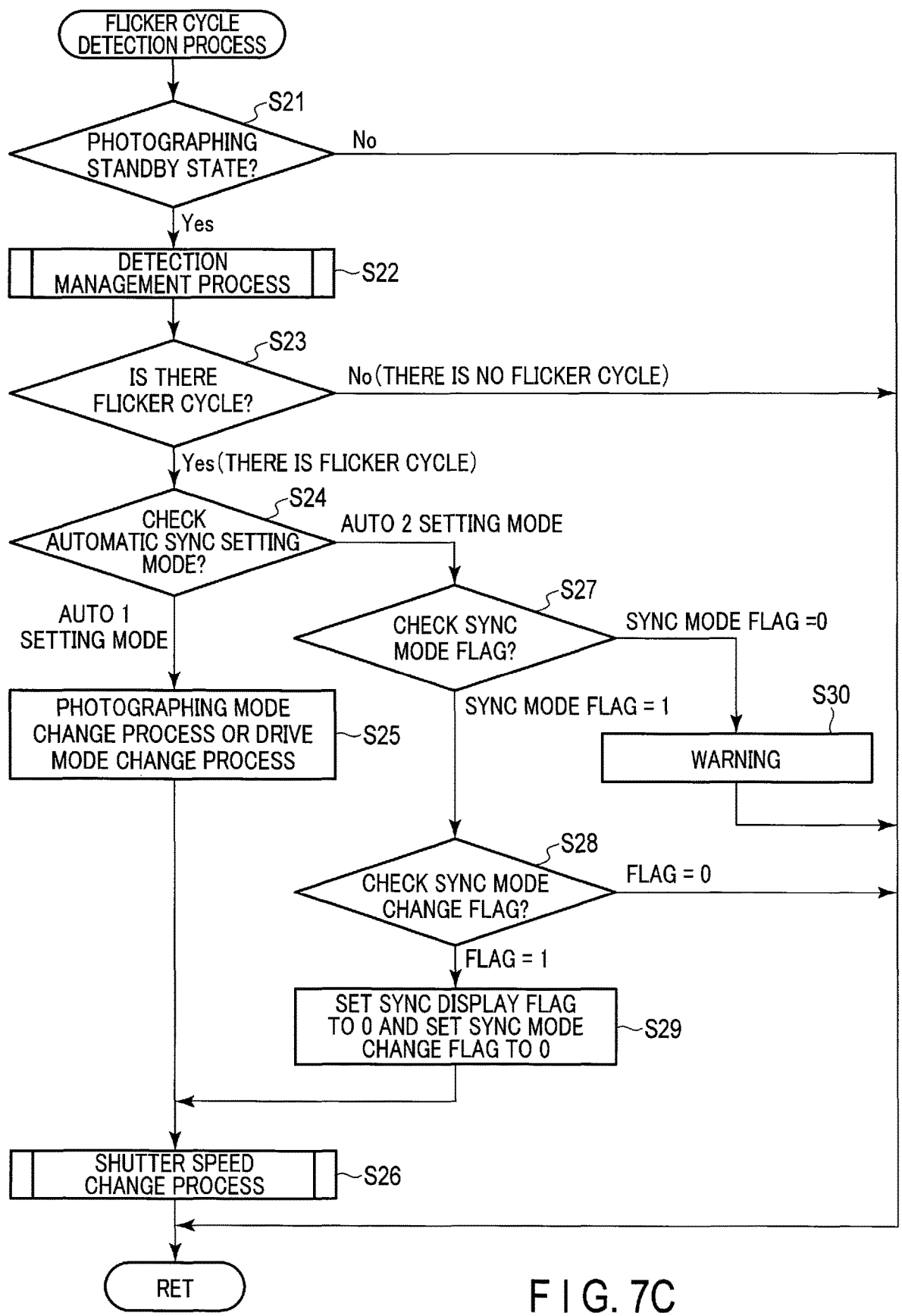
FIG. 7C is a flowchart showing an operation of the camera system for a flicker cycle detection process.

Next, the flicker cycle detection process shown in step S2 is described with reference to FIG. 7C. FIG. 7C is a flowchart showing the operation of the camera system 1 for a flicker cycle detection process.

In step S21, the system controller 225 checks whether the system controller 225 is in the photographing standby state. Specifically, the system controller 225 checks whether the image stabilizer 403 including the imaging element 417 and the photoelectric element 415a is standby. In this check, for example, in the ON state in which the power button (not shown) is ON, the system controller 225 checks whether power is supplied to the imaging element 417.

When it is determined in step S21 that the image stabilizer 403 is not in standby, the process proceeds to step S3. When it is determined that the image stabilizer 403 is standby, the process proceeds to step S22.

In step S22, the sensor 415 and the system controller 225 perform a detection management process to be described later. As will be described in detail later, in the detection management process, the sensor 415 detects an AC current component, and the system controller 225 manages the detection result of the sensor 415. The process proceeds to step S23.

In step S23, the system controller 225 determines whether there is the flicker cycle, based on the management in step S22. That is, the system controller 225 detects the flicker cycle in the luminous flux incident on the imaging element 417 from the AC current component detected by the sensor 415. In step S23, when it is determined that there is no flicker cycle, the process proceeds to step S3. When it is determined in step S23 that there is the flicker cycle, the process proceeds to step S24.

In step S24, the system controller 225 checks the automatic SYNC setting mode set in step S1. When it is determined that the automatic SYNC setting mode is the AUTO 1 setting mode, the process proceeds to step S25.

In step S25, the system controller 225 performs the photographing mode change process and the drive mode change process, and sets the SYNC mode flag to 1.

In the photographing mode change process, for example, the system controller 225 determines whether the photographing mode is the program (P) mode or the aperture priority (A) mode. When it is determined that the photographing mode is the P mode, the system controller 225 changes the exposure control program to the shutter priority (S) mode. When it is determined that the photographing mode is the A mode, the system controller 225 changes the exposure control program to the manual (M) mode. When the flicker cycle is detected, the system controller 225 changes the photographing mode to the S mode or the M mode.

In the drive mode change process, for example, the system controller 225 determines whether there is a drive mode using an electronic rolling shutter corresponding to the current setting. For example, when the current setting is the single shot mode and the single shot mode includes a mode (for example, a silent single shot mode) using the electronic rolling shutter, it is determined that there is the drive mode corresponding to the current setting and using the electronic rolling shutter. If it is determined that there is no drive mode corresponding to the current setting and using the electronic rolling shutter, the system controller 225 is changed to the drive mode which uses a predetermined specific electronic rolling shutter (for example, silent single shot mode). If it is determined that there is the drive mode corresponding to the current setting and using the electronic rolling shutter, the system controller 225 changes the drive mode from the drive mode of the current setting to the drive mode corresponding to the current setting and using the electronic rolling shutter.

Although the system controller 225 changes the drive mode to change the shutter mode to the electronic rolling shutter, the system controller 225 may be configured to directly change the shutter mode. That is, the shutter mode change process may be performed instead of the drive mode change process.

In step S26, the system controller 225 performs a shutter speed change process to be described later. The process proceeds to step S3.

In step S25, before the shutter speed change process in step S26, the system controller 225 performs the photographing mode change process and the drive mode change process, but the present embodiment is not limited thereto. In the photographing mode change process, for example, if the exposure control programs of the P mode and the A mode are set so as to fix the shutter speed to the optimum shutter speed for the flicker cycle, the photographing mode change process may be omitted. In addition, if the system controller 225 is configured so that precise control of the shutter speed is realized not only in the electronic rolling shutter but also in the mechanical shutter or the electronic front curtain shutter, the drive mode change process or the shutter mode change process may also be omitted.

In step S24, if it is determined that the automatic SYNC setting mode is the AUTO 2 setting mode, the process proceeds to step S27. In step S27, the system controller checks the SYNC mode flag.

If it is determined in step S27 that the SYNC mode flag is 1, the process proceeds to step S28. In step S28, the system controller 225 checks the SYNC mode change flag which is a flag for managing whether the normal live view display mode is changed to the first live view display mode for the first time after the standby of the image stabilizer 403. The SYNC mode change flag is a flag indicating that the SYNC mode flag has been changed from "0" to "1". The SYNC mode change flag has two states of 0 and 1. The initial value of the SYNC mode change flag is 1. By performing the determination in step S28, the value of the SYNC mode change flag is changed from 1 to 0, and the shutter speed change process based on the flicker cycle is limited to once.

If it is determined in step S28 that the SYNC mode change flag is 0, it is determined that the first live view display mode is the second time or later, and the process proceeds to step S3.

If it is determined in step S28 that the SYNC mode change flag is 1, it is determined that the first live view display mode is the first time, and the process proceeds to step S29. In step S29, the system controller 225 sets the SYNC display flag to 0 and sets the SYNC mode change flag to 0. Then, the process proceeds to step S26. In this case, the second live view display mode process is performed in step S7 after the end of the flicker cycle detection process.

If it is determined in step S27 that the SYNC mode flag is 0, the process proceeds to step S30. In step S30, the system controller 225 outputs a warning indicating that there is the flicker cycle. The system controller 225 outputs the warning to the display 221 which is an example of the output destination. As shown in FIG. 7D, the display 221 displays the warning as a character such as "Flicker" together with the normal live view image 351. The warning may be output from a speaker (not shown) of the camera body 200 as a sound. Such a warning can cause the user to recognize before photographing that lateral stripes will occur in a still image to be captured. Then, the user can set, before photographing, the high shutter speed at which no lateral stripes occur. The process proceeds to step S3.

Figure 7E:
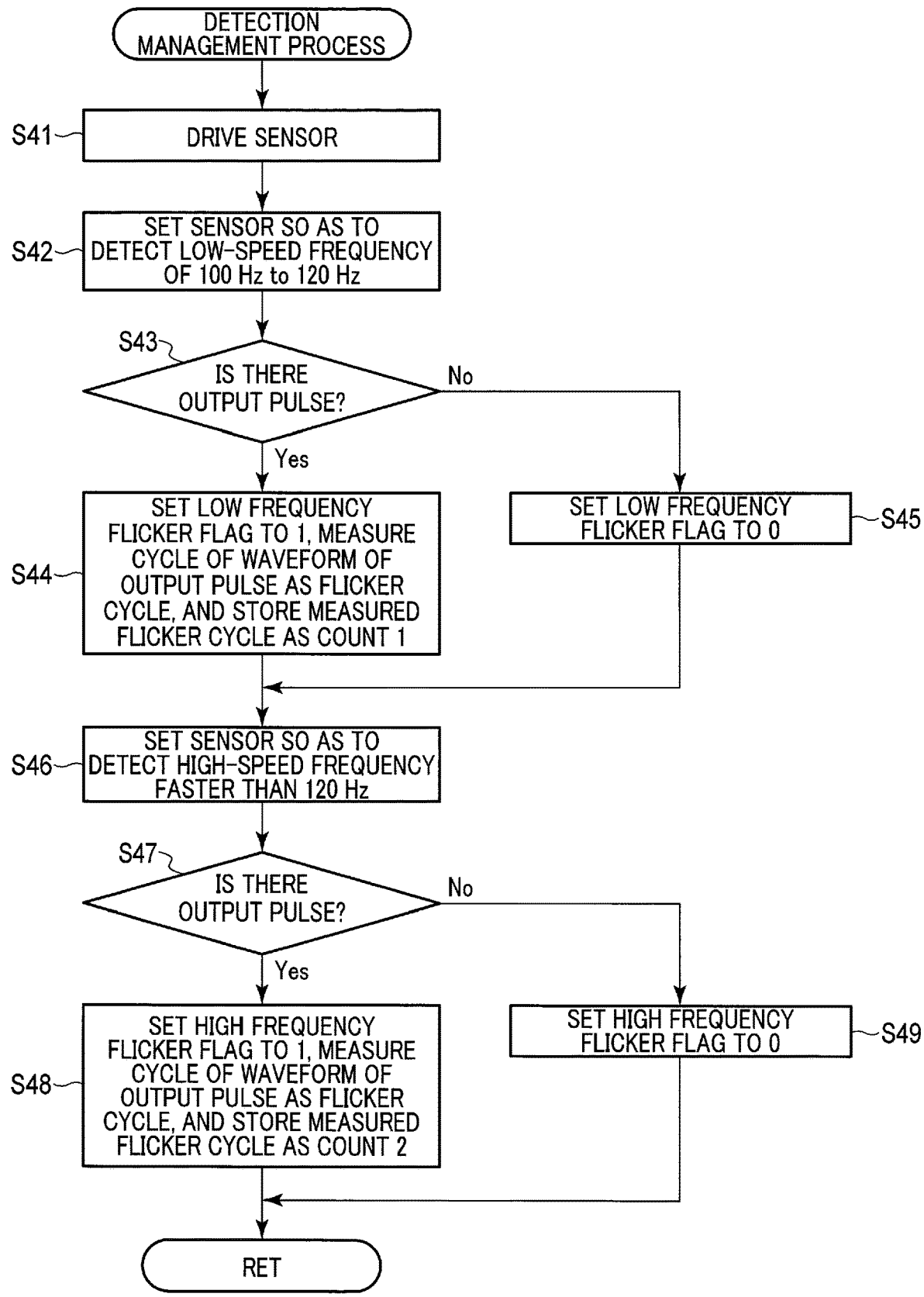
FIG. 7E is a flowchart showing an operation of the camera system for a detection management process for an AC current component.

Next, the detection management process shown in step S22 is described with reference to FIG. 7E. FIG. 7E is a flowchart showing the operation of the camera system 1 for the detection and management process. The detection management process is performed by the sensor 415 and the system controller 225.

In step S41, the system controller 225 quickly drives the sensor 415. Specifically, the system controller 225 supplies power to the power supply Vdd of the sensor 415, and the control (Ctrl) terminal sets the current amount of the current source I1 to the maximum. Due to this setting, the response characteristic (speed) of the operational amplifier OP1 is maximized. Therefore, the capacitor C1 is quickly charged, and the sensor 415 is in an equilibrium stable state in several milliseconds. The process proceeds to step S42.

In step S42, the system controller 225 sets the sensor 415 so that the sensor 415 can detect the low-speed frequency of 100 Hz to 120 Hz of the fluorescent lamp. Specifically, in the sensor 415, the system controller 225 reduces the current amount of the current source I1 through the control (Ctrl) terminal, the charge capability of the capacitor C1 is lowered by the operational amplifier OP1, and the response characteristic of the operational amplifier OP1 is set to 100 Hz or less, for example, about 10 Hz.

In step S42, if the photoelectric element 415a which is the photodiode D1 receives a part of the luminous flux L1 incident on the imaging element 417, the sensor 415 detects the AC current component of the luminous flux L1. Specifically, the AC current component of 100 Hz or more is input to and output from the base of the transistor Q3. When the AC current component is multiplied by being input to and output from the transistor Q3, an AC waveform appears at the collector of the transistor Q3. The AC waveform is shaped by the comparator COMP. The shaped AC waveform is output from the sensor 415 to the system controller 225 as an output pulse of the AC current component. The process proceeds to step S43.

In step S43, the system controller 225 determines whether there is the output pulse.

If it is determined in step S43 that there is the output pulse, the process proceeds to step S44. In step S44, the system controller 225 sets a low frequency flicker flag, which manages the presence or absence of the flicker cycle at the low-speed frequency, to 1. The low frequency flicker flag has two states of 0 and 1. The state of the low frequency flicker flag is alternately changed according to the presence or absence of the output pulse of the AC current component based on the low-speed frequency. In addition, a measuring instrument (not shown) provided in the system controller 225 measures, as the flicker cycle, the cycle of the waveform of the output pulse based on the low-speed frequency. The nonvolatile memory stores the measured flicker cycle as COUNT1.

If it is determined in step S43 that there is no output pulse, the process proceeds to step S45. The system controller 225 sets the low frequency flicker flag to 0.

As such, in steps S44 and S45, the system controller 225 manages the detection result of the sensor 415 by using the low frequency flicker flag. The process proceeds to step S46.

In step S46, the system controller 225 sets the sensor 415 so that the sensor 415 can detect a high-speed frequency faster than 120 Hz of a commercial power supply. Specifically, in the sensor 415, the system controller 225 increases the current amount of the current source I1 through the control (Ctrl) terminal. Then, the charge capability of the capacitor C1 is increased by the operational amplifier OP1. The response characteristic of the operational amplifier OP1 is set to, for example, 200 Hz or more.

In step S46, if the photoelectric element 415*a* which is the photodiode D1 receives a part of the luminous flux L1 incident on the imaging element 417, the sensor 415 detects the AC current component of the luminous flux L1. Specifically, the AC current component of the commercial power supply frequency is removed, and the AC current component having a frequency equal to or higher than the commercial power supply frequency is input to and output from the base of the transistor Q3. If the AC current component is multiplied by being input to and output from the transistor Q3, the AC waveform appears at the collector of the transistor Q3. The AC waveform is shaped by the comparator COMP. The shaped AC waveform is output from the sensor 415 to the system controller 225 as an output pulse of the AC current component. The process proceeds to step S47.

In step S47, the system controller 225 determines whether there is the output pulse.

If it is determined in step S47 that there is the output pulse, the process proceeds to step S48. In step S48, the system controller 225 sets a high frequency flicker flag, which manages the presence or absence of the flicker cycle at the high-speed frequency, to 1. The high frequency flicker flag has two states of 0 and 1. The state of the high frequency flicker flag is alternately changed according to the presence or absence of the output pulse of the AC current component based on the high-speed frequency. In addition, a measuring instrument (not shown) provided in the system controller 225 measures, as the flicker cycle, the cycle of the waveform of the output pulse based on the high-speed frequency. The nonvolatile memory stores the measured flicker cycle as COUNT2.

If it is determined in step S47 that there is no output pulse, the process proceeds to step S49. The system controller 225 sets the high frequency flicker flag to 0.

As such, in steps S48 and S49, the system controller 225 manages the detection result of the sensor 415 by using the high frequency flicker flag. The process proceeds to step S23 shown in FIG. 7C.

In step S23, the system controller 225 detects the flicker cycle, that is, determines the presence or absence of the flicker cycle, based on the state of the low frequency flicker flag managed in steps S44 and S45 and the state of the high frequency flicker flag managed in steps S48 and S49. Specifically, if both the low frequency flicker flag and the high frequency flicker flag are 0, it is determined that the flicker cycle is not detected, that is, there is no flicker cycle, and the process proceeds to step S3. If at least one of the low frequency flicker flag and the high frequency flicker flag is 1, it is determined that the flicker cycle has been detected, that is, there is the flicker cycle, and the process proceeds to step S24.

Next, the shutter speed change process shown in step S26 is described with reference to FIG. 7F. FIG. 7F is a flowchart showing the operation of the camera system 1 for the shutter speed change process.

In step S61, the system controller 225 checks whether the high frequency flicker flag is 1, that is, whether there is the flicker cycle at the high-speed frequency. If the high frequency flicker flag is not 1, the process proceeds to step S63, and if the high frequency flicker flag is 1, the process proceeds to step S62.

In step S62, the system controller 225 sets the shutter speed to a shutter speed close to the flicker cycle stored as COUNT2 in the second shutter speed series. The process proceeds to step S63.

In step S63, the system controller 225 checks whether the low frequency flicker flag is 1, that is, whether there is the flicker cycle at the low-speed frequency. If the low frequency flicker flag is not 1, the process proceeds to step S3, and if the low frequency flicker flag is 1, the process proceeds to step S64.

In step S64, the system controller 225 sets the shutter speed to a shutter speed close to the flicker cycle stored as COUNT1 in the second shutter speed series. The process proceeds to step S3.

In the shutter speed change process, in order to reduce the occurrence of lateral stripes, the system controller 225 sets the value of the shutter speed in preference to the flicker cycle by a low-speed frequency rather than the flicker cycle by the high-speed frequency. This is because, as the shutter speed is slower, the occurrence of fine lateral stripes can be reduced, and the occurrence of wide lateral stripes due to the low frequency can also be reduced. If the photographing is performed by using a fast shutter speed in preference to photographing a fast moving subject at the time of photographing a still image, the system controller 225 may reverse the order of the values of the shutter speeds and set the value of the shutter speed in preference to the flicker cycle by the high-speed frequency rather than the flicker cycle by the low-speed frequency. In this case, although the influence of flickering due to the low-speed frequency cannot be removed, there is an advantage that correction by post-processing is easy.

In the shutter speed change process, the system controller 225 sets the shutter speed for controlling the exposure time of the imaging element 417 to a shutter speed close to the flicker cycle in the second shutter speed series, but the present invention is not necessarily limited thereto.

In the normal live view display mode shown in step S4, the system controller 225 may add the first shutter speed close to the flicker cycle in the second shutter speed series to the first shutter speed series. Alternatively, the system controller 225 may add the second shutter speed, which is an integral multiple of the first shutter speed, to the first shutter speed series. Alternatively, the system controller 225 may set the shutter speed to a shutter speed close to the flicker cycle in the second shutter speed series, and may be changeable for each shutter speed which is the integer multiple.

Next, the first live view display mode process shown in step S6 of FIG. 7A.

The system controller 225 changes the imaging sequence to a sequence for reading all pixels of the image captured with the value of the shutter speed of the second shutter speed series. Accordingly, the system controller 225 displays the value of the shutter speed on the first live view image 353, for example, up to a first decimal place. The system controller 225 performs process of invalidating menu setting for the normal live view display mode. Specifically, the system controller 225 invalidates a function for realizing an ideal finder function for capturing a subject. This function has, for example, a function of a live view boost, a function of adjusting a frame rate, and a function of reducing flicker. The system controller 225 performs process of prohibiting the use of the operation member for the normal live view display mode. The image processor 213 makes the first live view image 353 high contrast so that the lateral stripes in the first live view image 353 can be easily recognized visually. The image processor 213 may change a hue or the like of the first live view image 353 for visually recognizing the lateral stripes. The system controller 225 sets a predetermined time for the non-operation time described in step S9. The system controller 225 set enlargement magnification in the enlarged live view display mode of the first live view display mode. The enlargement magnification is selected by the user from a magnification (hereinafter, referred to as the previous magnification) used at the time of the previous enlargement, a magnification (hereinafter, referred to as the pixel equal-magnification ratio) near the pixel equal magnification, and a preset fixed magnification. The enlargement magnification that can be set is a setting of a significant enlargement magnification for lateral stripes of each pixel line.

The system controller 225 checks an enlarged flag which is a flag for managing the state of the first live view display mode. The enlarged flag has three states of 0, 1, and 2. The state of the enlarged flag is sequentially changed according to the operation of the enlargement button 319. If it is determined that the enlarged flag is 0, the system controller 225 performs driving the display 221 in the normal magnification live view display mode. If it is determined that the enlarged flag is 1, the system controller 225 performs driving the display 221 in the enlarged frame display mode. If it is determined that the enlarged flag is 2, the system controller 225 performs driving the display 221 in the enlarged live view display mode. The process proceeds to step S8.

Next, the second live view display mode process shown in step S7 of FIG. 7A. In the second live view display mode process, the system controller 225 resets the setting so as to be the same as the normal live view display mode.

The system controller 225 changes the imaging sequence to the imaging sequence for performing the addition of pixels or the thinning-out reading of pixels on the image captured with the value of the shutter speed of the first shutter speed series. Accordingly, the system controller 225 displays the value of the shutter speed displayed on the second live view image 355, for example, up to one's place. The system controller 225 performs process of validating the menu setting for the normal live view display mode. The system controller 225 performs process of validating the use of the operation member for the normal live view display mode. The image processor 213 performs the image process for the normal live view display mode. This image process includes basic image process such as white balance correction process. The system controller 225 sets a predetermined time for the non-operation time described in step S9.

The system controller 225 checks an enlarged flag which is a flag for managing the state of the second live view display mode. The enlarged flag has three states of 0, 1, and 2. The state of the enlarged flag is sequentially changed according to the operation of the enlargement button 319. If it is determined that the enlarged flag is 0, the system controller 225 performs the process in the normal magnification live view display mode. By performing the process in the normal live view display mode, the second live view image 355 can be displayed. If it is determined that the enlarged flag is 1, the system controller 225 performs the process in the enlarged frame display mode. By performing the process in the enlarged frame display mode, the enlarged frame display image (not shown) in which the enlarged frame (not shown) is added to the second live view image 355 can be displayed. If it is determined that the enlarged flag is 2, the system controller 225 performs the enlarged live view display mode, and can display the enlarged live view image (not shown) obtained by enlarging the image enclosed by the enlarged frame (not shown) displayed in the enlarged frame display image (not shown). The process proceeds to step S6. Next, the button/dial process shown in step S8 will be described. The button/dial process includes a button/dial process for the first live view display mode, the second live view display mode, and the normal live view display mode.

First, the button/dial process for the first live view display mode will be described.

The shutter speed is changed with the coarse step or the fine step depending on the difference in the operation methods such as the up/down buttons or the R-dial 315. If the F-dial 317 is operated, the system controller 225 changes the enlargement magnification to the enlargement magnification set in the first live view mode display process shown in step S6. The system controller 225 performs the automatic sweep process. In the first live view display mode, the shutter speed series has values of a large number of shutter speeds with the finer steps such as 1/50 step to 1/500 step. In this case, it takes time for the user to manually set the shutter speed from these shutter speeds. In order to omit this time, the system controller 225 performed the flicker cycle detection process and automatically sweeps the shutter speed detected in the flicker cycle detection process, by depressing the OK button 323 by the user. Then, the process proceeds to step S8.

Next, the button/dial process for the second live view display mode will be described.

The system controller 225 determines which one of the R-dial 315 for changing the shutter speed and the F-dial 317 for changing the photographing mode is rotated by the user. If it is determined that the R-dial 315 is rotated, the system controller 225 changes the set shutter speed to a value which is a value of an integral multiple or 1/integer of a current setting value. If it is determined that the F-dial 317 is rotated, the system controller 225 determines whether the photographing mode is an S mode or an M mode. If it is determined that the photographing mode is the S mode, the system controller 225 changes the exposure correction value. If it is determined that the photographing mode is the M mode, the system controller 225 changes the aperture value. The process proceeds to step S9.

Next, the button/dial process for the normal live view display mode will be described.

The system controller 225 processes various button operations other than the display mode change button 325. The process proceeds to step S9.

In the present embodiment, the photoelectric element 415a receives a part of the luminous flux from the subject incident on the imaging element 417, and the sensor 415 detects the AC current component of the luminous flux from the luminous flux received by the photoelectric element 415a. The system controller 225 detects the flicker cycle in the luminous flux from the AC current component. Therefore, it is possible to provide the camera system 1 which can detect the presence or absence of flicker generated by the LED light source or the like before photographing.

In the AUTO 2 setting mode in which the shutter speed is set to semi-auto, even in the normal live view display mode, the warning is output when the flicker cycle is detected. Therefore, even in the normal live view display mode in which it is difficult for the user to visually recognize lateral stripes, the user can recognize before photographing that lateral stripes exist in the still image. The opportunity that can easily set the high shutter speed at which no lateral stripes occur before photographing is given to the user, and the still image can be captured without lateral stripes and display delay after setting the high shutter speed.

After the flicker cycle is detected, the shutter speed is set to a shutter speed close to the flicker cycle in the second shutter speed series which is a series finer than the first shutter speed. Therefore, in the first and second live view display modes, the shutter speed can be set without strict lateral stripes. Therefore, the still picture can be photographed without lateral stripes.

After the flicker cycle is detected, the first shutter speed close to the flicker cycle in the second shutter speed series is added to the first shutter speed series. Alternatively, the second shutter speed which is the integer multiple of the first shutter speed is added to the first shutter speed series. Therefore, even in the normal live view display mode, it is possible to set the shutter speed that does not strictly have lateral stripes.

In addition, if the first live view image 353 continues to be displayed, the temperature of the imaging element 417 continues to rise and the S/N ratio of the image signal output from the imaging element 417 deteriorates. Therefore, ideal low noise photographing becomes difficult. In addition, if the temperature further rises, the operation of the imaging element 417 may be stopped. In this way, the chance of photographing may be lost. In the present embodiment, since the display mode is changed to the second live view display mode when the non-operation time passes a predetermined time in the first live view display mode, the temperature of the imaging element 417 can be suppressed from rising, and the loss of the shutter chance can be prevented in advance.

Second Embodiment

Figure 8:
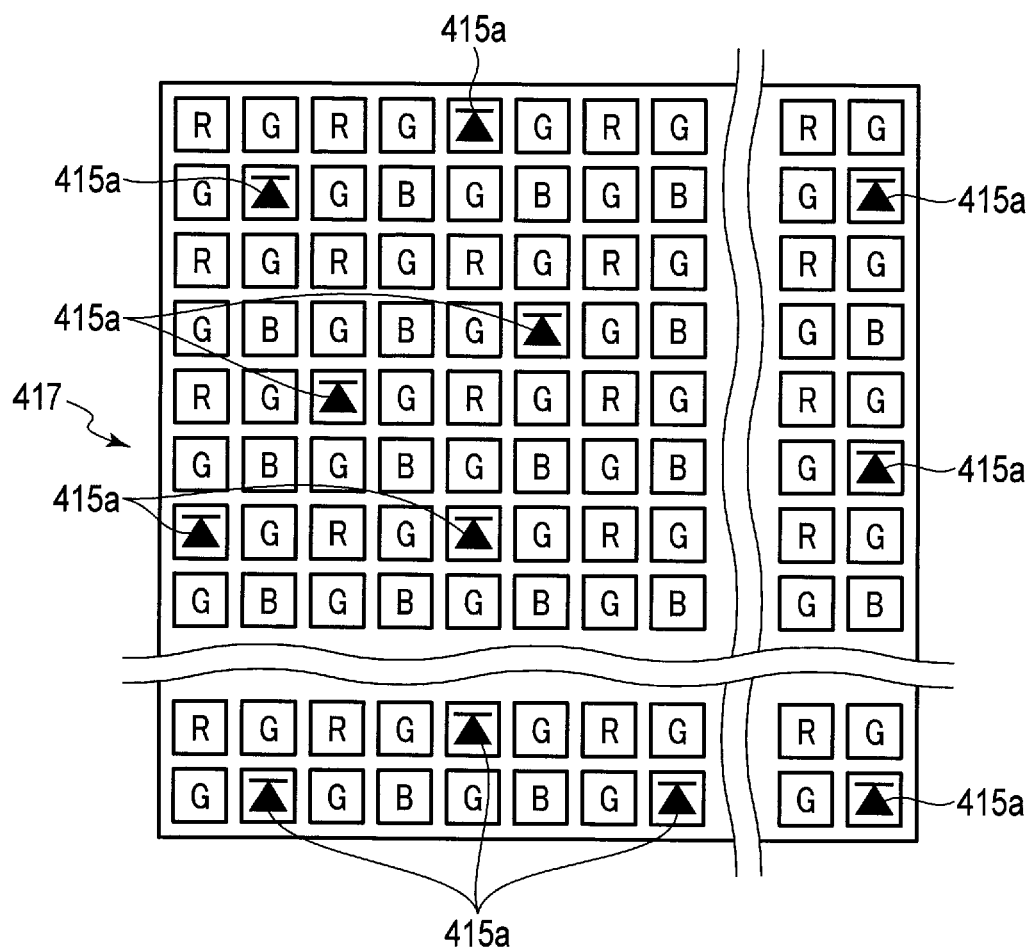
FIG. 8 is a diagram showing a second embodiment of the present invention, and a diagram showing a configuration of an imaging element in which an optical element is incorporated.

Hereinafter, the second embodiment is described with reference to FIG. 8. In the present embodiment, a difference from the first embodiment is mainly described. FIG. 8 is a diagram showing the configuration of the imaging element 417.

The photoelectric element 415a is discretely incorporated in the effective pixel area of the imaging element 417. Therefore, the photoelectric element 415a can receive more light from the luminous flux from the subject, and the sensor 415 can detect more AC current components. The portion of the effective pixel area where the photoelectric element 415a is arranged is regarded as the pixel being defective, and the image in this portion is interpolated by, for example, pixel mapping techniques. The photoelectric element 415a is preferably arranged asymmetrically not to have periodicity in order to prevent deterioration of the image quality.

The imaging element 417 is preferably a back illumination type in which the wiring of the photoelectric element 415a does not compress gaps between pixels. Therefore, it is possible to prevent the gaps between the pixels from being shielded by the wiring of the photoelectric element 415a, and it is possible to suppress a decrease in the light collecting capability (opening area) of the imaging element 417 which collects the luminous flux from the subject.

Figure 10:
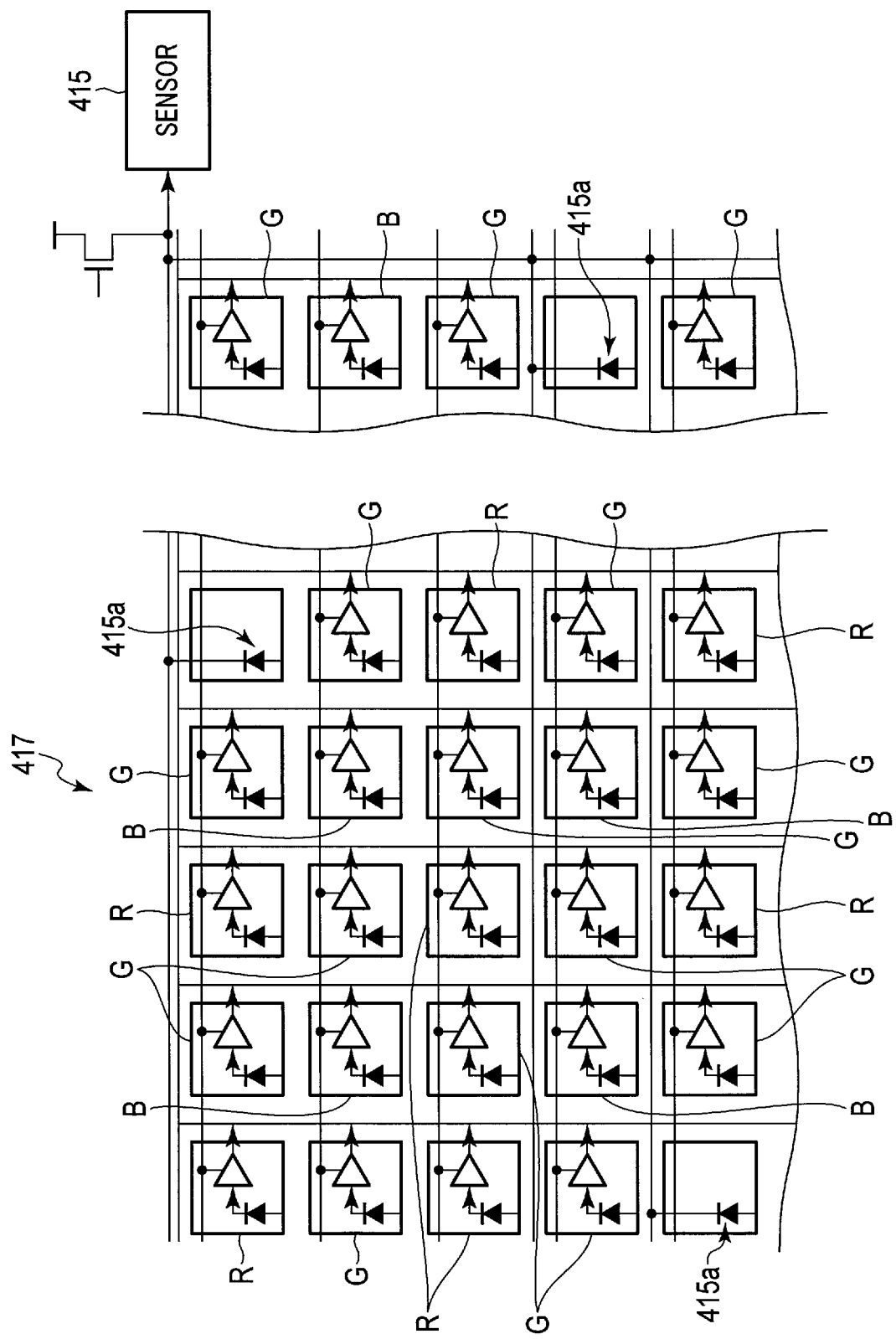
FIG. 10 is a diagram showing a configuration example of wiring in the imaging element shown in FIG. 9.

As shown in FIG. 9, the photoelectric element 415a may be configured so as to be incorporated only in the peripheral portion of the effective pixel area of the imaging element 417. Therefore, since the wiring area is also sufficiently secured outside the effective pixel area without affecting the captured image, it can be diverted to an imaging element which is not the back illumination type. Here, FIG. 10 shows a part of the configuration of the wiring in the imaging element 417 shown in FIGS. 9 and 10. As shown in FIG. 10, the wiring of the photoelectric element 415a is connected to the sensor 415 by a wired OR. Therefore, it is unnecessary to acquire image data at an imaging timing of a predetermined time interval, and it is possible to constantly monitor AC light. Generally, the imaging timing is about 240 fps at the maximum. Due to this, in the imaging sequence, the speed is insufficient to capture flickering light of several kHz to several hundred kHz. In the configuration shown in FIG. 10, since the AC light component is detected as an analog waveform without using the imaging sequence control, it is possible to detect AC light in any frequency range. In the configuration shown in FIG. 10, the photocurrent from the photoelectric element 415a is read out by separating the imaging sequence for detecting the image data and the imaging sequence for detecting the AC light. The configuration shown in FIG. 10 includes a first readout sequence for reading pixels having no photoelectric element 415a, and a second readout sequence for reading pixels having the photoelectric element 415a at a faster speed than the first readout sequence. Therefore, the imaging element 417 can capture flicking light of several kHz to several hundred kHz. In addition, the present embodiment is not necessarily limited to the analog detection. In the present embodiment, the signal of the pixel may be AD converted and read out separately from the normal readout sequence for the image data at a sampling frequency several tens of times that of the flicking light.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imaging device, comprising:
   an imaging unit configured to sequentially output a digital image by capturing a subject;
   a sensor configured to include a photoelectric element for receiving a part of luminous flux from the subject incident on the imaging unit to detect an AC current component of the luminous flux from the luminous flux received by the photoelectric element; and
   a controller configured to detect a flicker cycle in the luminous flux from the AC current component, change a series value in a first shutter speed series and a series value in a second shutter speed series, the first shutter speed series being a series of shutter speed values set to the imaging unit, and the second shutter speed series being a series of shutter speed values set to the imaging unit and being finer than the first shutter speed series, and control an exposure time of the imaging unit according to the series value of the first shutter speed series or the series value of the second shutter speed series.

2. The imaging device according to claim 1, wherein the controller warns that there is the flicker cycle, when the flicker cycle is detected.

3. The imaging device according to claim 1, wherein the controller changes a photographing mode to a shutter priority mode or a manual mode, when the flicker cycle is detected.

4. The imaging device according to claim 1, wherein the controller is changed to a shutter mode or a drive mode, when the flicker cycle is detected.

5. The imaging device according to claim 1, wherein the controller sets a shutter speed for controlling the exposure time to a shutter speed close to the flicker cycle in the second shutter speed series, when the flicker cycle is detected.

6. The imaging device according to claim 1, wherein the controller sets a shutter speed for controlling the exposure time to a shutter speed close to the flicker cycle in the second shutter speed series, and changes the shutter speed for each shutter speed of an integer multiple, when the flicker cycle is detected.

7. The imaging device according to claim 1, wherein the controller adds a first shutter speed, which is close to the flicker cycle in the second shutter speed series, or a second shutter speed, which is an integer multiple of the first shutter speed, to the first shutter speed series, when the flicker cycle is detected.

8. The imaging device according to claim 1, further comprising an image stabilizer including the imaging unit and the sensor configured to move the imaging unit within a plane perpendicular to an optical axis.

9. The imaging device according to claim 1, wherein the imaging unit is a back illumination type.

10. An imaging device, comprising:

an imaging unit configured to sequentially output a digital image by capturing a subject;

a sensor configured to include a photoelectric element for receiving a part of luminous flux from the subject incident on the imaging unit to detect an AC current component of the luminous flux from the luminous flux received by the photoelectric element; and a controller configured to detect a flicker cycle in the luminous flux from the AC current component, wherein the photoelectric element is discretely incorporated in an effective pixel area of the imaging unit, and wherein the controller further reads a signal from the imaging unit in one of a first readout sequence for reading pixels not having the photoelectric element and a second readout sequence for reading pixels having the photoelectric element at a speed faster than the first readout sequence.

11. An imaging device, comprising:

an imaging unit configured to sequentially output a digital image by capturing a subject;

a sensor configured to include a photoelectric element for receiving a part of luminous flux from the subject incident on the imaging unit to detect an AC current component of the luminous flux from the luminous flux received by the photoelectric element; and a controller configured to detect a flicker cycle in the luminous flux from the AC current component, wherein the photoelectric element is incorporated only in a peripheral portion of an effective pixel region of the imaging unit, and wherein the controller further reads a signal from the imaging unit in one of a first readout sequence for reading pixels not having the photoelectric element and a second readout sequence for reading pixels having the photoelectric element at a speed faster than the first readout sequence.

12. An imaging device, comprising:

an imaging unit configured to sequentially output a digital image by capturing a subject;

a sensor configured to include a photoelectric element for receiving a part of luminous flux from the subject incident on the imaging unit to detect an AC current component of the luminous flux from the luminous flux received by the photoelectric element; and a controller configured to detect a flicker cycle in the luminous flux from the AC current component, wherein the controller further reads a signal from the imaging unit in one of a first readout sequence for reading pixels not having the photoelectric element and a second readout sequence for reading pixels having the photoelectric element at a speed faster than the first readout sequence.

* * * * *